United States Patent
Wolff et al.

(10) Patent No.: US 11,637,573 B1
(45) Date of Patent: Apr. 25, 2023

(54) CFR ERROR DEPOSITION OUT OF THE TRANSMISSION BAND

(71) Applicant: NOKIA SOLUTIONS AND NETWORKS OY, Espoo (FI)

(72) Inventors: Gunter Wolff, Laupheim (DE); Radoslaw Ceszkiel, Wroclaw (PL); Grzegorz Haza, Wroclaw (PL); Björn Jelonnek, Ulm (DE); Michael Weber, Neu Ulm (DE)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 17/962,801

(22) Filed: Oct. 10, 2022

(30) Foreign Application Priority Data

Oct. 8, 2021 (FI) .................................... 20216045

(51) Int. Cl.
*H04B 1/04* (2006.01)
*H04B 1/00* (2006.01)

(52) U.S. Cl.
CPC ............. *H04B 1/0057* (2013.01); *H04B 1/04* (2013.01); *H04B 2001/0408* (2013.01)

(58) Field of Classification Search
CPC .... H04B 1/02; H04B 1/04; H04B 2001/0408; H04B 2001/045; H04B 2001/0491; H01B 1/0057; H01B 1/0067
See application file for complete search history.

(56) References Cited

U.S. PATENT DOCUMENTS

| | | | |
|---|---|---|---|
| 6,449,302 B2 * | 9/2002 | Hunton | H04B 1/707 375/284 |
| 7,675,982 B2 * | 3/2010 | Zhang | H04L 27/2624 375/296 |

(Continued)

FOREIGN PATENT DOCUMENTS

WO 2018/111244 A1 6/2018

OTHER PUBLICATIONS

Communication of Acceptance—section 29 a of patents Decree dated Mar. 10, 2022 corresponding to Finnish Patent Application No. 20216045.

(Continued)

*Primary Examiner* — Quochien B Vuong
(74) *Attorney, Agent, or Firm* — Squire Patton Boggs (US) LLP

(57) ABSTRACT

An apparatus comprises a digital processing device configured to generate a digital transmission signal, a digital-to-analog converter connected to the digital processing device and configured to convert the digital transmission signal into an analog transmission signal, and a power amplifier connected to the digital-to-analog converter and configured to amplify the analog transmission signal. An antenna filter is connected to the power amplifier and configured to filter the amplified analog transmission signal; the antenna filter is configured to pass frequencies in at least one passband and to attenuate frequencies in at least one stopband. The digital processing device is configured to perform a process of reducing peak power in the digital transmission signal; in this process error components having different frequencies are produced. A frequency spectrum of the error components is manipulated such that a part of the error components is deposited in the stopband of the antenna filter.

39 Claims, 27 Drawing Sheets

(56) References Cited

U.S. PATENT DOCUMENTS

| | | | |
|---|---|---|---|
| 8,260,144 B2* | 9/2012 | Gupta | H04B 10/40 398/115 |
| 9,432,228 B2* | 8/2016 | Pashay-Kojouri | H04B 15/00 |
| 10,972,326 B2 | 4/2021 | Megretski et al. | |
| 2007/0089015 A1 | 4/2007 | Saul | |
| 2016/0277229 A1 | 9/2016 | Dick | |
| 2017/0331650 A1 | 11/2017 | Martinez | |
| 2020/0052656 A1 | 2/2020 | Dezfooliyan et al. | |
| 2020/0287769 A1 | 9/2020 | Laporte | |
| 2021/0176107 A1 | 6/2021 | Hou et al. | |

OTHER PUBLICATIONS

Finnish Search Report dated Mar. 10, 2022 corresponding to Finnish Patent Application No. 20216045.
Extended European Search Report dated Dec. 19, 2022 corresponding to European Patent Application No. 22182178.8.

* cited by examiner

CFR ERROR DEPOSITION OUT OF THE TRANSMISSION BAND

CROSS REFERENCE TO RELATED APPLICATION

This application claims the benefit of Finnish Patent Application No. 20216045, filed Oct. 8, 2021. The entire content of the above-referenced application is hereby incorporated by reference.

FIELD OF THE INVENTION

The present invention relates to an apparatus, a method and a computer program product for reducing peak power in a digital transmission signal.

RELATED BACKGROUND ART

The following meanings for the abbreviations used in this specification apply:
ASIC Application-Specific Integrated Circuit
CF Crest Factor
CFR Crest Factor Reduction, algorithms designed to limit PAR
DAC Digital-to-Analog Converter
DFE Digital Front End
EVM Error Vector Magnitude, a measure of signal distortion
FIR Finite Impulse Response
FPGA Field Programmable Gate Array
FRM Frequency Response Masking
GSM Global System for Mobile Communications
IIR Infinite Impulse Response
LTE Long Term Evolution
MCS Modulation and Coding Scheme
MIMO Multiple Input Multiple Output
mMIMO massive MIMO
NR New Radio
PA Power Amplifier
PAR Peak to Average power Ratio
QAM Quadrature Amplitude Modulation
QPSK Quadrature Phase Shift Keying
RAT Radio Access Technology
RF Radio Frequency
RM Radio Module
SNR Signal-to-Noise Ratio
WCDMA Wideband Code Division Multiple Access Example embodiments, although not limited to this, relate to the field of Crest Factor Reduction (CFR) applied in radio transmission systems.

CFR is a technique used to reduce the PAR (Peak-To-Average power Ratio) of transmitted signals so that the power amplifier can operate more efficiently. However, when applying CFR, error components will be produced, and according to the prior art, it is necessary to basically limit these to the transmission band available for the operator, for example.

SUMMARY OF THE INVENTION

Example embodiments address this situation aim to improve procedures for reducing peak power (such as CFR described above) in a digital transmission signal.

According to a first aspect, an apparatus is provided which comprises: a digital processing device configured to generate a digital transmission signal, a digital-to-analog converter connected to the digital processing device and configured to convert the digital transmission signal into an analog transmission signal, a power amplifier connected to the digital-to-analog converter and configured to amplify the analog transmission signal, and an antenna filter connected to the power amplifier and configured to filter the amplified analog transmission signal, wherein the antenna filter is configured to pass frequencies in at least one passband and to attenuate frequencies in at least one stopband, wherein the digital processing device is configured to perform: a process of reducing peak power in the digital transmission signal, wherein in this process error components having different frequencies are produced, and manipulating a frequency spectrum of the error components such that at least a part of the error components is deposited in the at least one stopband of the antenna filter.

According to a second aspect, a method for controlling an apparatus is provided, the apparatus comprising a digital processing device configured to generate a digital transmission signal, a digital-to-analog converter connected to the digital processing device and configured to convert the digital transmission signal into an analog transmission signal, a power amplifier connected to the digital-to-analog converter and configured to amplify the analog transmission signal, and an antenna filter connected to the power amplifier and configured to filter the amplified analog transmission signal, wherein the antenna filter is configured to pass frequencies in at least one passband and to attenuate frequencies in at least one stopband, wherein the method comprises:
a process of reducing peak power in the digital transmission signal, wherein in this process error components having different frequencies are produced, and
manipulating a frequency spectrum of the error components such that at least a part of the error components is deposited in the at least one stopband of the antenna filter.

The first and second aspects may be modified as follows:

As the process of reducing peak power, a crest factor reduction algorithm may be applied.

A plurality of stopbands may be provided, and the antenna filter may be configured to attenuate the frequencies more strongly in at least one of the stopbands, which is defined as an enhanced stopband, than in the other stopbands, and a higher level of error components may be disposed in the enhanced stopband than in other stopbands which are not enhanced stopbands.

A transition region may be defined between the at least one passband and the at least one stopband, and no error components may be deposited in the transition region.

In the crest factor reduction algorithm, a predefined threshold for reducing the peak power and a predefined frequency response for manipulating the frequency spectrum of the error components may be applied.

The crest factor reduction algorithm may comprise at least one crest factor reduction stage, each crest factor reduction stage including a pulse generation means configured to clip the amplitude of an input signal based on the threshold, a pulse shaping means configured to restrict the frequency of the output signal of the pulse generation means to frequencies of the at least one passband and the at least one stopband based on the predefined frequency response, and a subtracting means configured to subtract the output signal of the pulse generation means from the input signal.

A plurality of crest factor reduction stages may be provided in series.

For each of the plurality of crest factor reduction stages, the same predefined threshold and/or the same predefined frequency response may be applied, or alternatively, different predefined thresholds and/or different predefined frequency responses may be applied.

The crest factor reduction algorithm may further comprise an up-sampling means configured to up-sample the digital transmission signal and to provide the up-sampled digital transmission signal as the input signal of the crest factor reduction stage or to the first one of a series connection of the crest factor reduction stages, wherein the sample rate raised during the up-sampling may be used in all crest factor reduction stages and for the signal transmission via the digital-to-analog converter.

The apparatus may further comprise an antenna, wherein the antenna may be configured to receive the analog transmission signal output from the antenna filter.

An available room for depositing error components may be determined based on a spectral mask emission limit, a margin to the mask, and/or an antenna filter stopband attenuation measured in dB and is a function of the frequency f, and the frequency spectrum of the error components may be manipulated such that the error components do not exceed the determined available room at any frequency.

An available room for depositing error components may be determined based on the following formula:

$$\text{DumpingRoom\_dBm}(f) = \text{EmissionLimit\_dBm}(f) - \text{Margin\_dB}(f) - \text{AntennaFilterAttenuation\_dB}(f),$$

wherein

DumpingRoom_dBm(f) is the room available for depositing error components measured in dBm/Hz and is a function of the frequency f, EmissionLimit_dBm(f) is the spectral mask emission limit measured in dBm/Hz and is a function of the frequency f, Margin_dB(f) is the margin to the mask measured in dB and is a function of the frequency f, and AntennaFilterAttenuation_dB(f) is the antenna filter stopband attenuation measured in dB and is a function of the frequency f, and wherein the frequency spectrum of the error components may be manipulated such that the error components do not exceed DumpingRoom_dBm(f) at any frequency.

The available room for depositing error components may be determined also by considering an attenuation of the power amplifier.

A frequency response for manipulating a frequency spectrum of the error components may be obtained from the frequency response of the antenna, the frequency response of the antenna filter and the frequency response of the power amplifier.

The at least one passband may correspond to at least one carrier having a predetermined bandwidth.

The amount of the error components in a certain frequency range of the antenna filter's stopband may be determined as a function of the position of the frequency range.

The antenna filter may be configured to attenuate frequencies in the at least one stopband with respect to frequencies passed in the at least one passband.

The antenna filter may be configured to attenuate frequencies in the at least one enhanced stopband with respect to frequencies in other stopbands which are not enhanced stopbands.

According to a third aspect, a base station is provided which comprises an apparatus according to the first aspect or its modifications.

According to a fourth aspect, a mobile device is provided which comprises an apparatus according to the first aspect or its modifications.

The method according to the second aspect or its modifications may be carried out in a base station or in a mobile station.

According to a fifth aspect of the present invention a computer program product is provided which comprises code means for performing a method according to the second aspect or its modifications when run on a processing means or module. The computer program product may be embodied on a computer-readable medium, and/or the computer program product may be directly loadable into the internal memory of the computer and/or transmittable via a network by means of at least one of upload, download and push procedures.

According to a sixth aspect, an apparatus is provided which comprises means for generating a digital transmission signal, means for converting the digital transmission signal into an analog transmission signal, means for amplifying the analog transmission signal, means for filtering the amplified analog transmission signal, wherein the means for filtering comprises means for passing frequencies in at least one passband and means for attenuating frequencies in at least one stopband, means for performing a process of reducing peak power in the digital transmission signal, wherein in this process error components having different frequencies are produced, and means for manipulating a frequency spectrum of the error components such that at least a part of the error components is deposited in the at least one stopband of the means for filtering.

BRIEF DESCRIPTION OF THE DRAWINGS

These and other objects, features, details and advantages will become more fully apparent from the following detailed description of example embodiments, which is to be taken in conjunction with the appended drawings, in which.

DETAILED DESCRIPTION OF EXAMPLE EMBODIMENTS

In the following, description will be made to example embodiments. It is to be understood, however, that the description is given by way of example only, and that the described example embodiments are by no means to be understood as limiting the present invention thereto.

Before describing example embodiments, in the following, problems of the prior art are discussed in some more detail.

As mentioned above, example embodiments, although not limited to this, relate to the field of Crest Factor Reduction (CFR) applied in radio transmission systems. Crest Factor Reduction is a technique used commonly to improve the performance of systems which require accurate and power efficient amplification of a signal. A radio signal transmitter is an example of such a system as it must produce a precisely modulated, high power output in order to achieve a required throughput and range of a radio transmission.

The key part of a radio transmitter is a power amplifier (PA), responsible for amplifying an analog signal before it is sent to a radio antenna and thus extending the range of a transmission.

Figure 3:
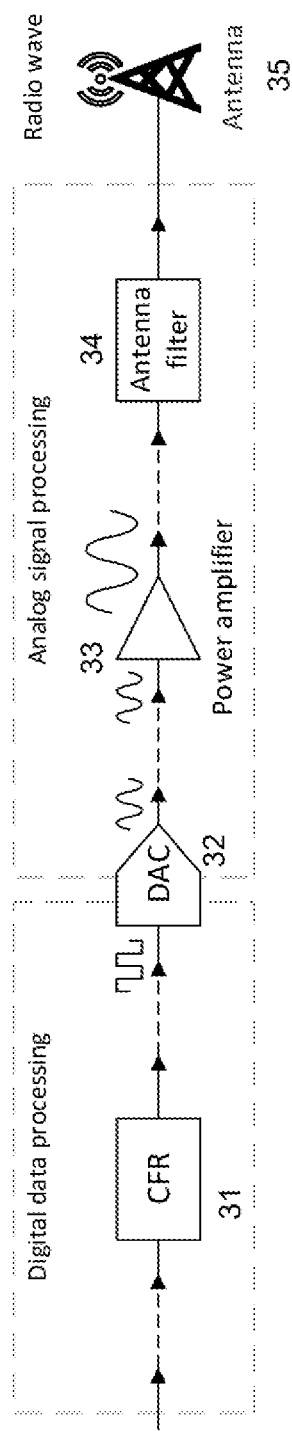
FIG. 3 illustrates a radio transmitter according to prior art.

FIG. 3 illustrates a radio transmitter including a CFR 31, a digital-to-analog converter (DAC) 32, a power amplifier 33, an antenna filter 34 and an antenna 35. The power amplifier 33 is responsible for amplifying an analog signal going to the radio antenna. In this example, the analog signal is provided by the DAC 32 converting digital data. The CFR 31 limits signal peak power which enables reliable operation of the power amplifier 33 and improves its efficiency. The antenna filter 34 attenuates unwanted emissions outside of a transmission band.

The power amplifier works reliably only for a specific range of input power. Feeding the PA with a signal that exceeds the PAs maximum acceptable input power at any instant would result in saturating the signal and distort the output. In extreme cases it can also damage the PA.

Figure 4:
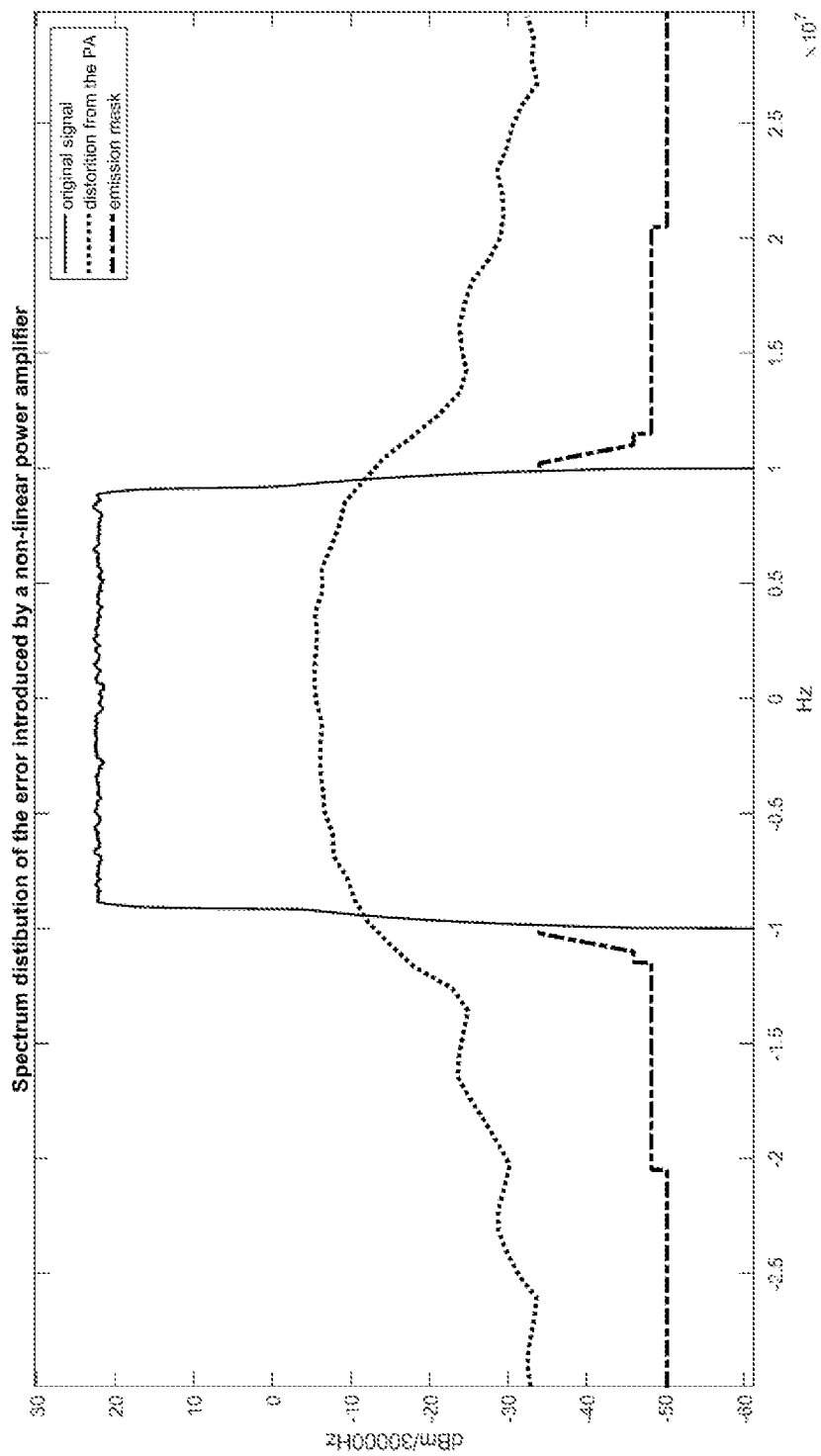
FIG. 4 illustrates distortion resulting from saturating a signal in a power amplifier, i.e. how a signal error from an uncontrolled saturation at the PA transforms into in-band distortion and out-of-band emission.

An example for this is shown in FIG. 4. The distortion resulting from saturating a signal in the power amplifier can be visualized in the spectrum of the output signal as an additive noise (distortion from the PA) interfering with the transmitted LTE carrier (original signal). In-band distortion decreases Signal-to-Noise Ratio (SNR) and thus limits transmission throughput. Out-of-band emission violates regulations requiring limiting out-of-band emissions to specified emission mask.

Unlike e.g. GSM, the modern Radio Access Technologies (RATs), like WCDMA, LTE, NR or 6G would theoretically build signals with a peak power of some magnitudes higher than the average power. In order to avoid problems with such a high peak power an extreme scaling down of the signal would be required.

However, even a moderate scaling down of the transmitted signal still affects its average power and limits the range of the transmission. To avoid the trouble with scaling down the signal, a reliable limitation of the peak power at the peak power capability of the PA is required. This will limit the peak power of the signal without virtually affecting the average transmit power. The figure of merit for reaching that goal is the Peak-to-Average power Ratio (PAR) of the signal.

Crest Factor Reduction (CFR) is a family of algorithms specialized in limiting the PAR of a signal fed into a power amplifier. Usually, a CFR algorithm modifies digital data which are later converted to an analog signal which is passing through the power amplifier.

Figure 5:
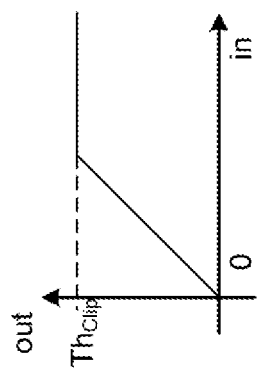
FIG. 5 illustrates an example amplitude saturation characteristic.

The easiest way of limiting the PAR of a signal is to saturate its amplitude with a characteristic as shown in FIG. 5. Saturation occurs at the threshold ThClip.

Simultaneously, the spectral mask must be fulfilled as well. Since the bare saturation characteristic produces a widespread spectral response, similar to the response of the PA shown in FIG. 4, spectral limitation must be applied to the signal.

Figure 6:
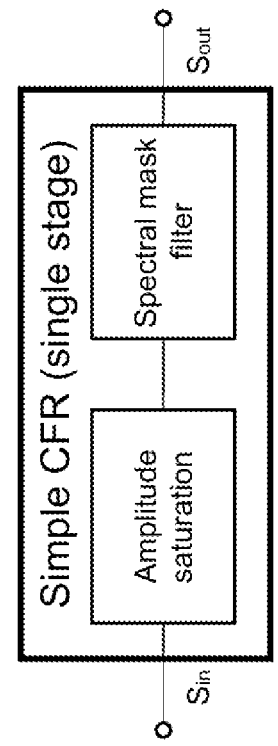
FIG. 6 shows an example of a simple CFR algorithm.

FIG. 6 shows an example of a simple CFR algorithm, wherein spectral limitation is applied by a subsequent spectral mask filter.

However, the spectral limitation in a simple CFR algorithm causes a partial regrowth of some signal peaks above the threshold ThClip. The CFR performance can be improved by applying the simple CFR algorithm repeatedly where the combination of amplitude saturation and spectral mask filtering constitutes a simple CFR stage.

If several simple CFR stages are cascaded, the signal's peak power converges at the clipping threshold ThClip.

It is noted that the algorithm shown in FIG. 6 constitutes an example of a later referred CFR stage, but as used in the prior art.

Unlike simple scaling, a CFR can reliably limit the signal peak power even in case of an extremely high peak power of the input, which is essential for a reliable operation of a PA. A CFR limits the peak power with only a small decrease of the average power, thus it can effectively reduce also the signal PAR.

In addition, CFR controls the spectrum of the saturated and thus distorted signal in order not to interfere with radio services in other frequency regions.

Reducing the peak power of the input signal reduces the power consumption of the PA and thus allows using a cheaper PA with a lower peak power capability.

CFR prevents uncontrolled distortion of the signal caused by a power amplifier but is a source of signal distortion by itself. The distortion can be measured as Error Vector Magnitude—EVM. High EVM increases Signal to Noise Ratio (SNR) and thus limits throughput of the transmission.

EVM can be calculated for the whole signal or for some frequency regions. E.g., when transmitting several LTE carriers on a single antenna, the EVM can be measured separately for the individual carriers or as a single value for the whole transmitted signal.

Figure 7:
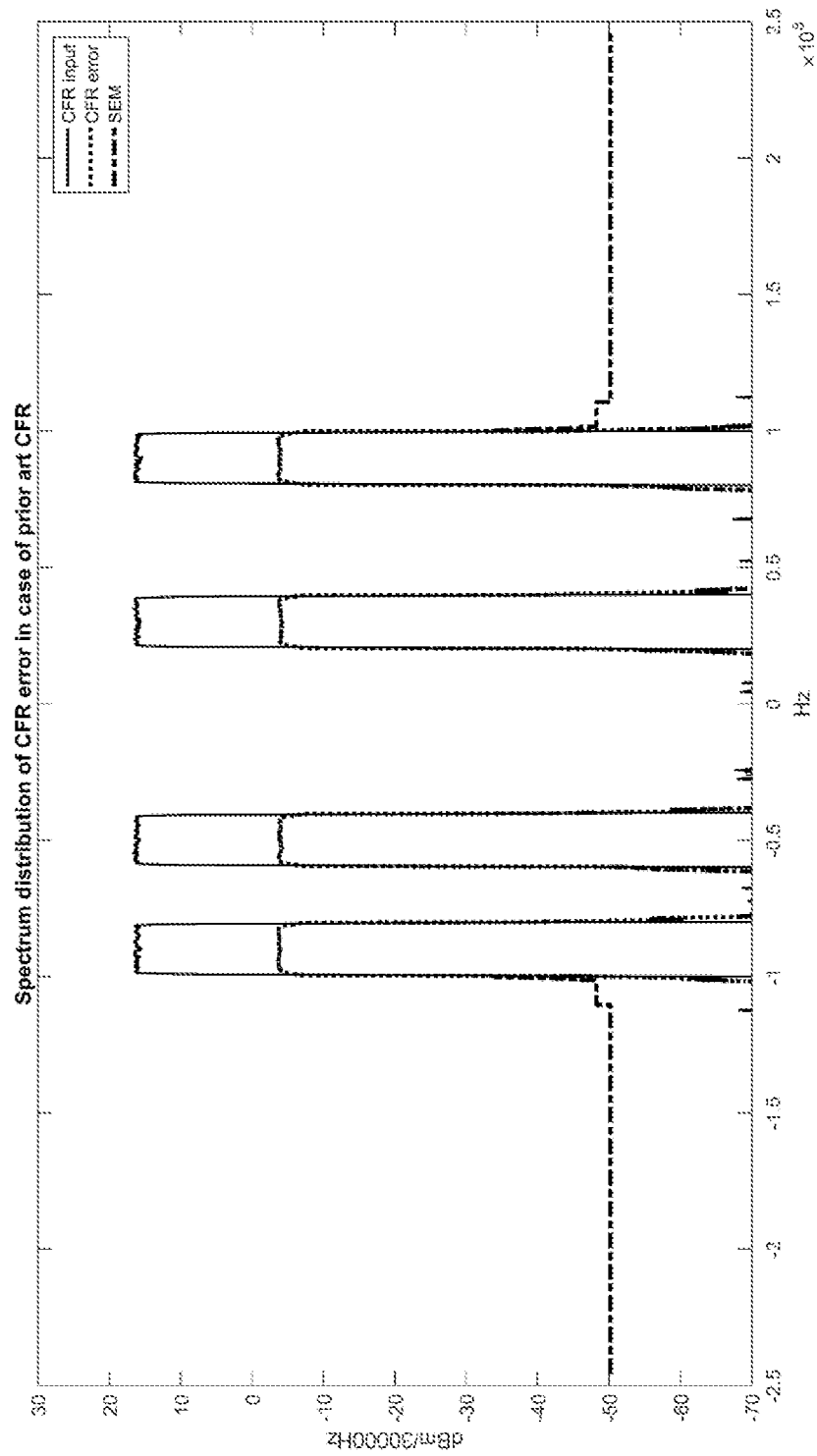
FIG. 7 shows an arrangement of 4 LTE carriers and an example of the CFR error from prior art CFR.

FIG. 7 shows an arrangement of 4 LTE carriers, and illustrates an example of CFR error produced with CFR algorithm in case of transmitting a signal composed of the 4 LTE carriers. A carrier arrangement is defined by the type, the frequency location and the power of each involved carrier. An EVM value for a carrier corresponds to the ratio between the power of the CFR noise interfering with the carrier and the power of the transmitted carrier.

The advantage of CFR is that unlike the PA, it can localize the distortion error inside the channel available for the transmission.

Generating error by the CFR cannot be avoided which limits the reduction of the PAR. Beyond the required signal quality, the achievable PAR depends on the carrier arrangement and the effectiveness of the CFR.

Still, for a given carrier arrangement and a given CFR algorithm there is a clear relationship between PAR and error from distortion: The lower the required PAR, the higher error is caused by the CFR.

Figure 8:
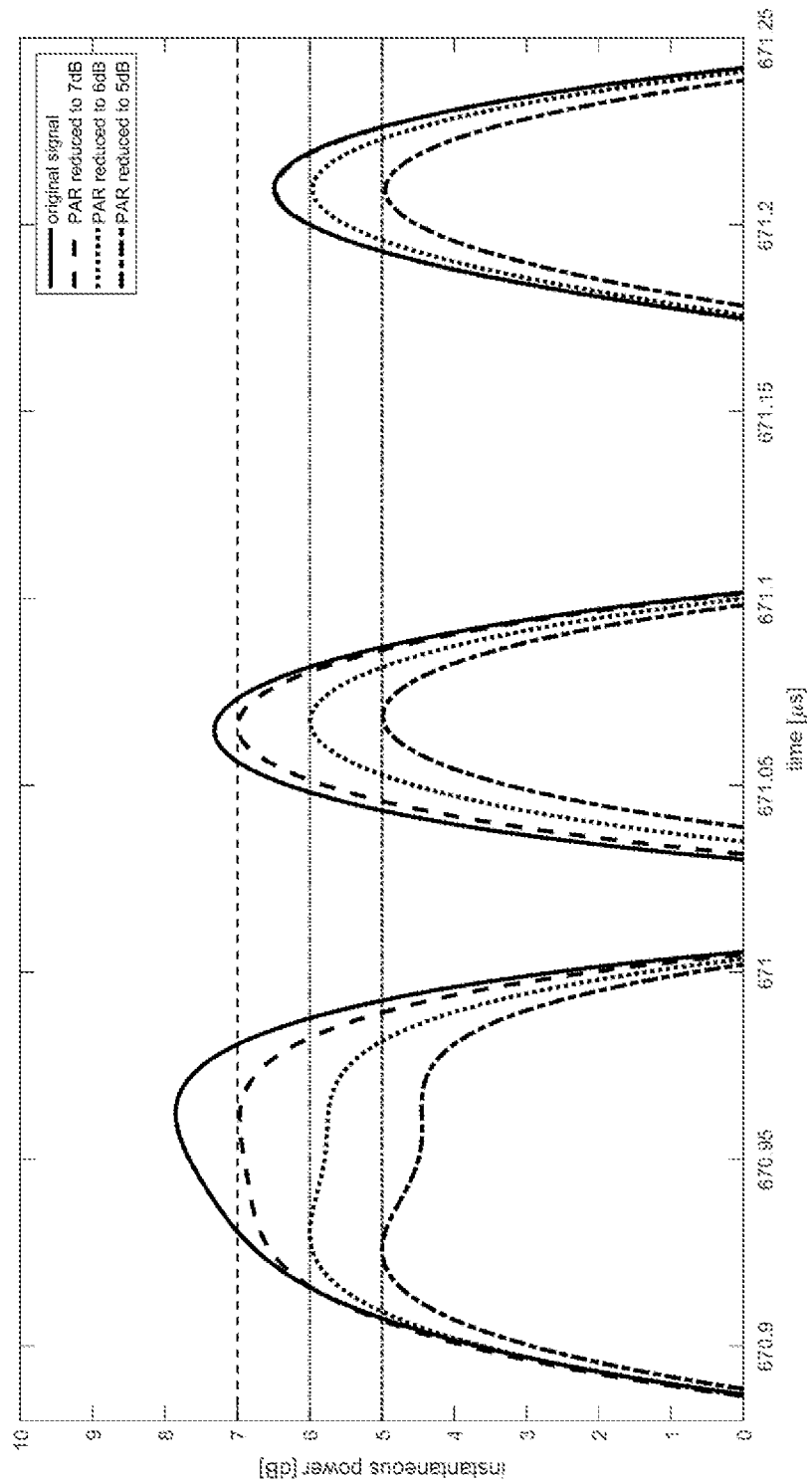
FIG. 8 illustrates how CFR limits peak power to a required level, wherein three different examples are shown, one for each peak power limit.

This is illustrated in FIG. 8, wherein three different examples are shown, one for each peak power limit. CFR limits peak power to a required level above the average power. Limiting peak power distorts the signal—the lower the peak level, the higher the distortion.

Figure 9:
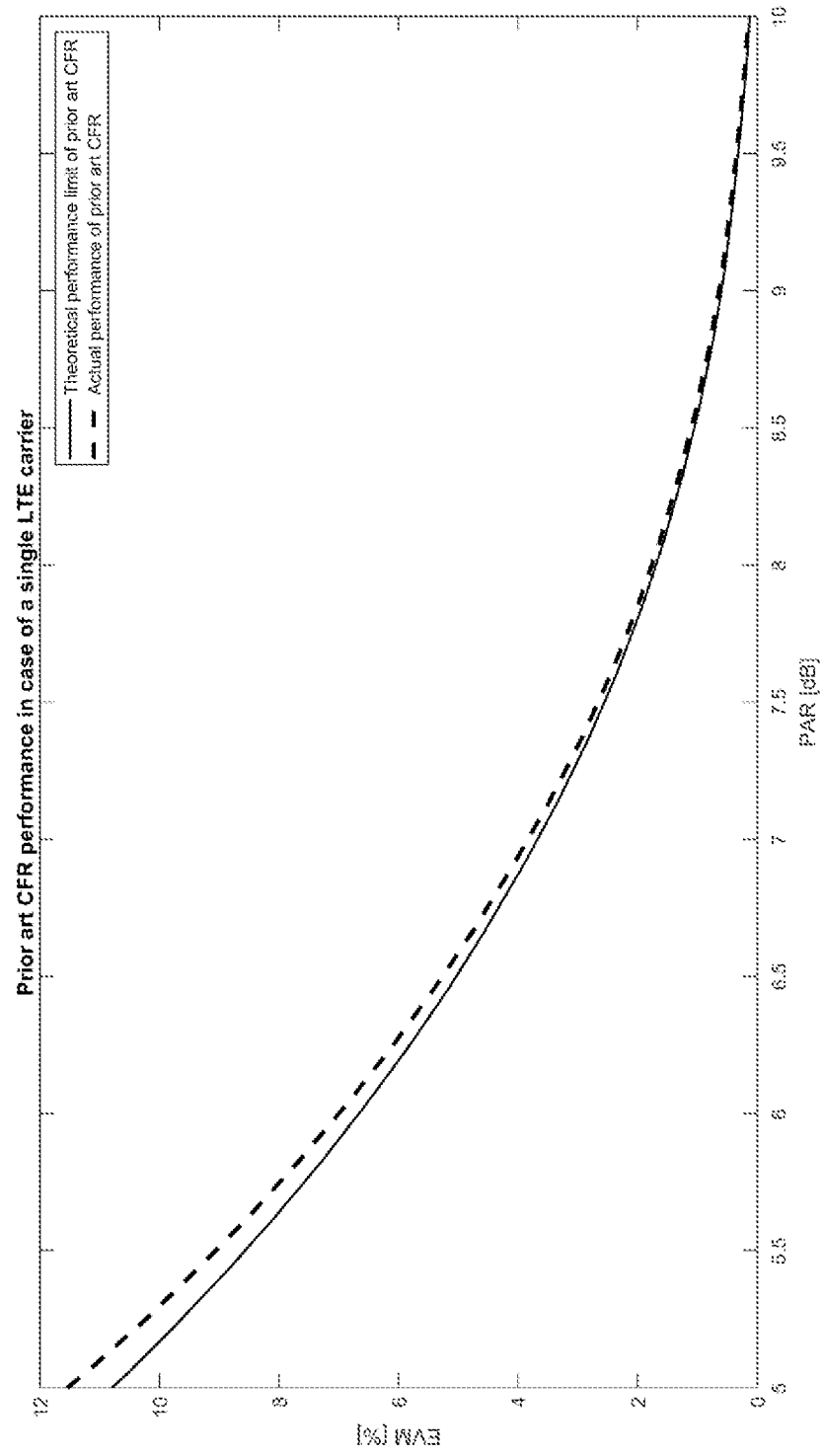
FIG. 9 shows an example for the relation between PAR and EVM for an LTE carrier.

Assuming a certain carrier arrangement, the relation between error (given as EVM) and PAR is very consistent among existing CFR algorithms. The reason is that there is a mathematical limit for the CFR performance and state-of-the-art CFR algorithms are performing close to this theoretical limit. An example for the relation between PAR and EVM for an LTE carrier is shown in FIG. 9. It is noted that the solid line refers to the infinite cascading of FIG. 6, whereas 2 to 4 cascades are commonly used in state-of-the-art algorithms.

The above PAR-EVM relation shows that a state-of-the-art CFR cannot achieve a total error (EVM) below the theoretical performance limit. This error can be translated to an upper estimate for the maximum throughput achievable (in perfect transmission conditions) for a certain PAR.

While the total error produced by CFR cannot be smaller than the theoretical limit, it is possible to manipulate the spectrum of the error so that it is lower in some frequency regions (and thus interferes less with the transmission) and higher in others. This way, the total amount of error is increased, but the distribution of the error may be more convenient in a given situation.

The difficulty is that the bandwidth available for distributing the error is limited to the bandwidth of the transmission and cannot be extended to another channel which is occupied by a different operator.

Example embodiments are directed to overcome the above problems.

In the following, a general overview of some example embodiments is described by referring to FIGS. 1 and 2A.

Figure 1:
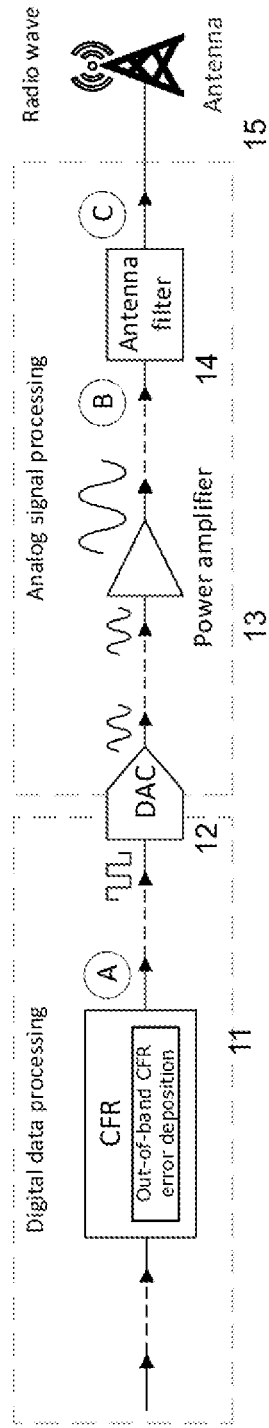
FIG. 1 shows a radio transmitter according to an example embodiment.
Figure 2A:
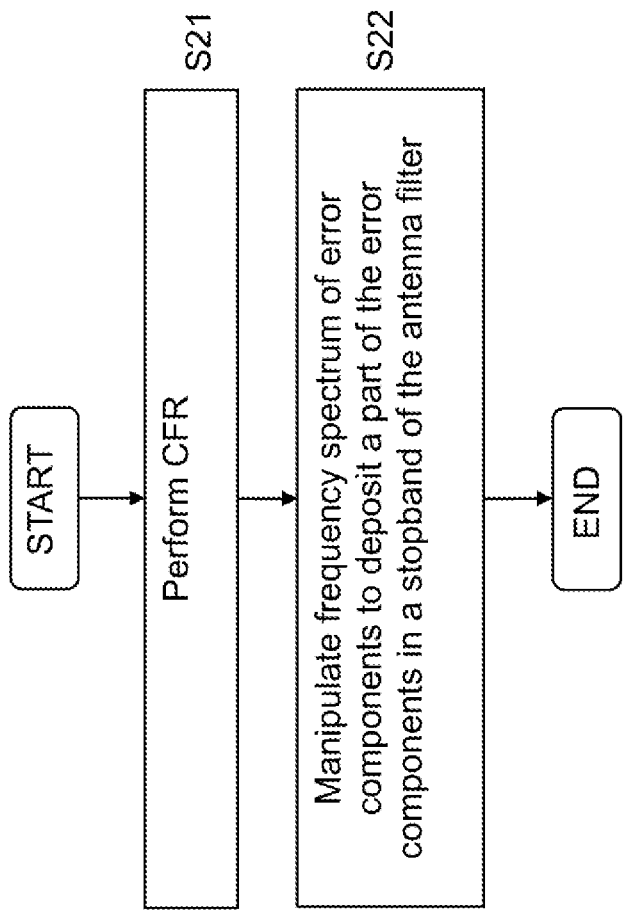
FIG. 2A shows a process carried out by a digital processing device of the radio transmitter according to the example embodiment.

FIG. 1 shows a radio transmitter as an example for an apparatus according to an embodiment. The apparatus comprises a digital processing device (indicated as CFR in FIG. 1) 11 configured to generate a digital transmission signal, a digital-to-analog converter 12 connected to the digital processing device 11 and configured to convert the digital transmission signal into an analog transmission signal, a power amplifier 13 connected to the digital-to-analog converter 12 and configured to amplify the analog transmission signal, and an antenna filter 14 connected to the power amplifier 13 and configured to filter the amplified analog transmission signal, wherein the antenna filter 14 is configured to pass frequencies in at least one passband and to attenuate frequencies in at least one stopband. The digital processing device 11 is configured to perform: a process of reducing peak power in the digital transmission signal, wherein in this process error components having different frequencies are produced (as shown in S21 of FIG. 2A), and manipulating a frequency spectrum of the error components such that at least a part of the error components is deposited in the at least one stopband of the antenna filter (as shown in S22 of FIG. 2A).

Thus, in this way, the process of reducing peak power in the digital transmission signal is carried out such that at least a part of the error components produced in this process are deposited in a frequency band which is blocked by the antenna filter.

Hence, according to example embodiments, the antenna filter's stopband attenuation is exploited in order to deposit the error components, i.e, is exploited for out-of-band noise dumping.

In FIG. 1, the digital processing device is indicated as device carrying out a crest factor reduction (CFR) function. However, it is noted that this is only an example, and other ways for reducing the peak power in the digital transmission signal may be applied.

Moreover, as shown in FIG. 1, the output of the antenna filter 14 may be supplied to an antenna 15, which may be part of the radio transmitter.

Hence, by the measures described above, error components produced by performing CFR on a digital transmission signal are deposited in a stopband of the antenna filter. These error components are thus attenuated and when they are transmitted via the antenna, they do not affect neighbouring frequency bands of other operators, for example. Hence, the process of reducing peak power (e.g., CFR) in a digital transmission signal is further improved.

Figure 2B:
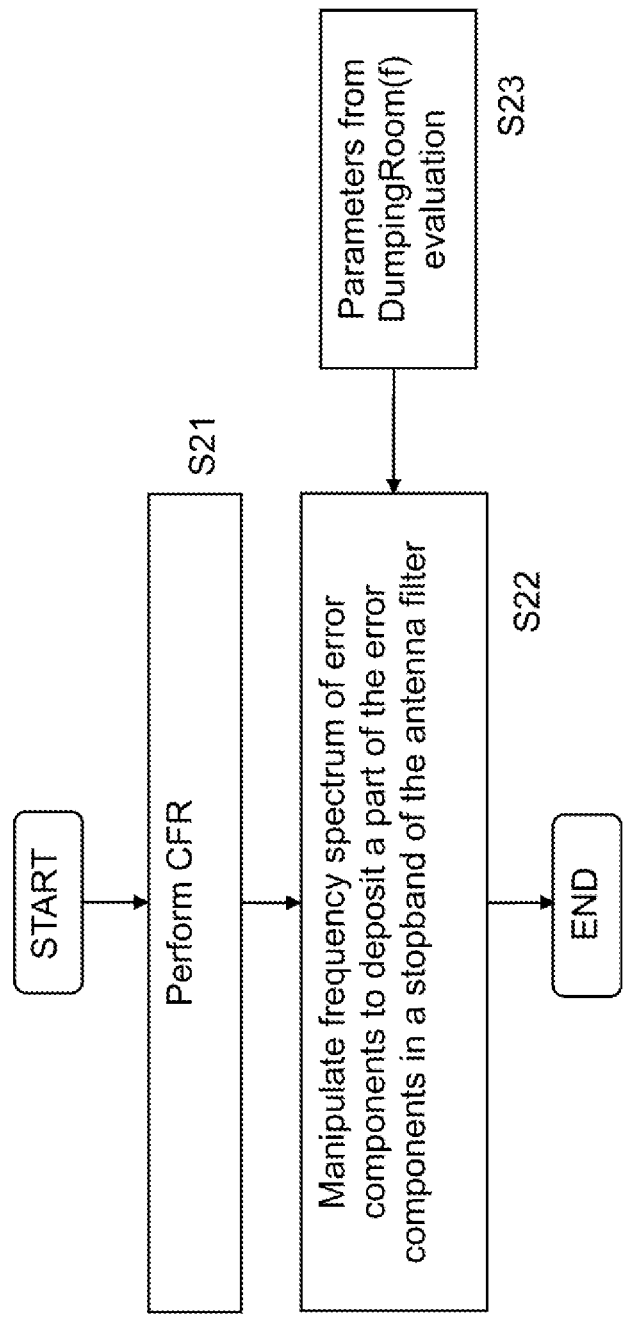
FIG. 2B shows a more detailed process carried out by the digital processing device according to a further example embodiment.

FIG. 2B shows a more detailed process carried out by the digital processing device according to a further example embodiment, in which it is shown how the process in S22 is carried out. In particular, as shown in S23 in FIG. 2B, for S22, parameter from a noise dumping room evaluation (a DumpingRoom(f) evaluation) are used in order to manipulate a frequency spectrum of the error components such that at least a part of the error components is deposited in the at least one stopband of the antenna filter. Namely, when such a noise dumping room is specified, the error components can be deposited by considering the noise dumping room. The noise dumping room is an available room for depositing error components and can be determined based on a spectral mask emission limit, a margin to the mask and/or an antenna filter stop band attenuation, for example. Moreover, also an attenuation of the power amplifier can be considered The DumpingRoom(f) is an example for a room (in a frequency range) in which the clipping error can be deposited (which is also referred to as noise dumping). In other words, the DumpingRoom(f) is an example for a room available for noise dumping. The DumpingRoom(f) may also be measured in dBm/Hz and may then be referred to as DumpingRoom_dBm(f).

In the following, the above general embodiments are further described by referring to some further detailed embodiments.

In particular, some example embodiments allow to reduce the CFR error in the transmission band significantly below the theoretical limit of state-of-the-art algorithms, which is expressed as EVM in FIG. 9. This novel behavior is achieved by depositing a part of the CFR error outside the transmission band.

Figure 10:
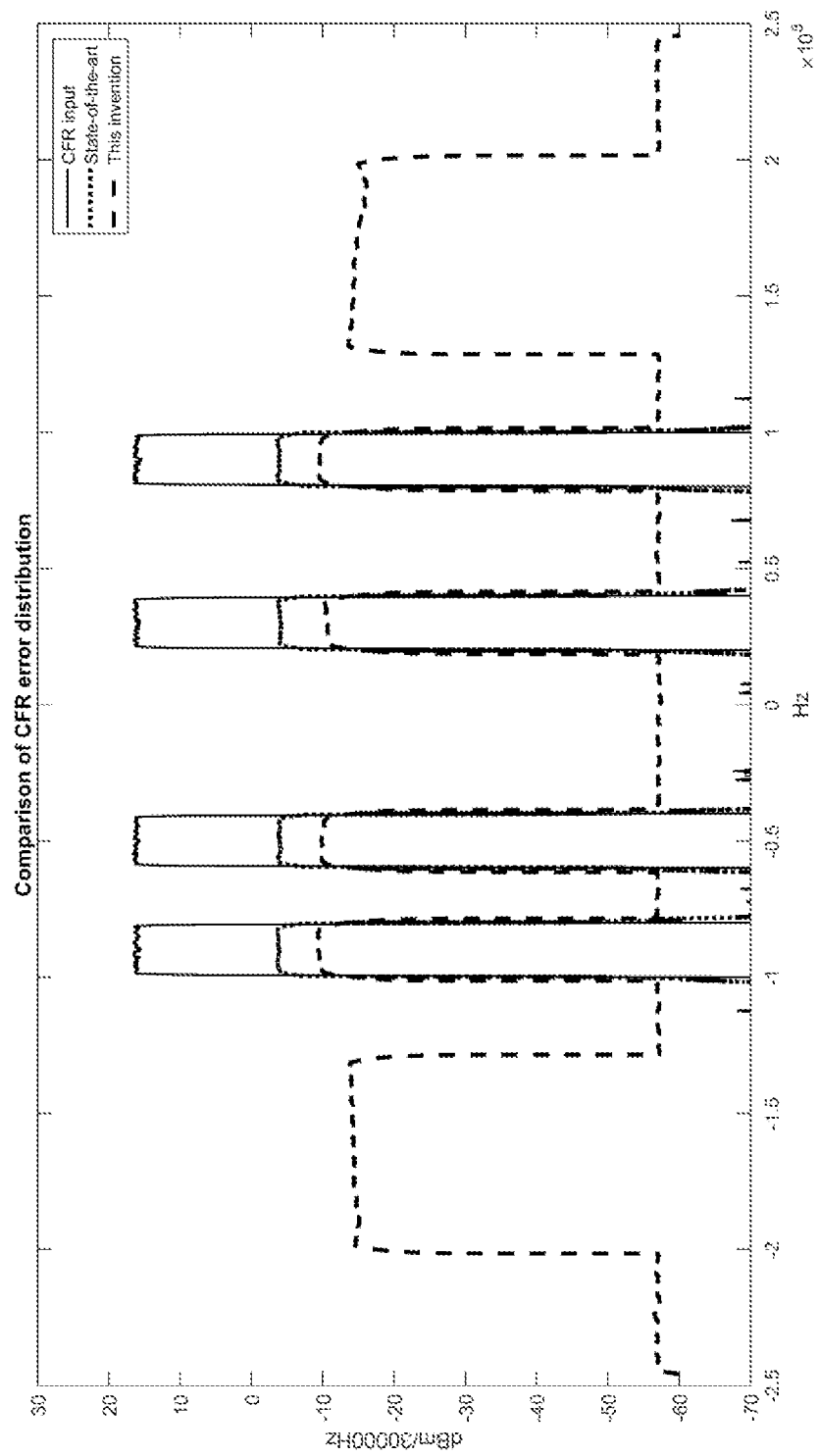
FIG. 10 compares the spectral distribution of CFR error postulated by an example embodiment with the error generated by a state-of-the-art algorithm.

FIG. 10 compares the distribution of CFR error postulated by an example embodiment with the error generated by a state-of-the-art algorithm. This allows decreasing error level inside the carriers at the cost of generating out-of-band emissions.

Usually, this deposition of the CFR error violates requirements on unwanted emissions outside the transmission band. Still, there is an antenna filter present after the power amplifier. This antenna filter doesn't have to be added or modified for this embodiment. It attenuates these unwanted out-of-band emissions. According to this embodiment, the deposited CFR error is limited to a level that the already present antenna filter provides a large enough stopband attenuation to reach an emission level which fulfils the requirements.

It is again referred to FIG. 1 showing a radio transmitter according to an example embodiment. The radio transmitter comprises a CFR 11, a DAC 12, a power amplifier (PA) 13, an antenna filter 14 and an antenna 15. FIG. 1 also shows some reference points A, B and C, which will be described later.

Figure 11:
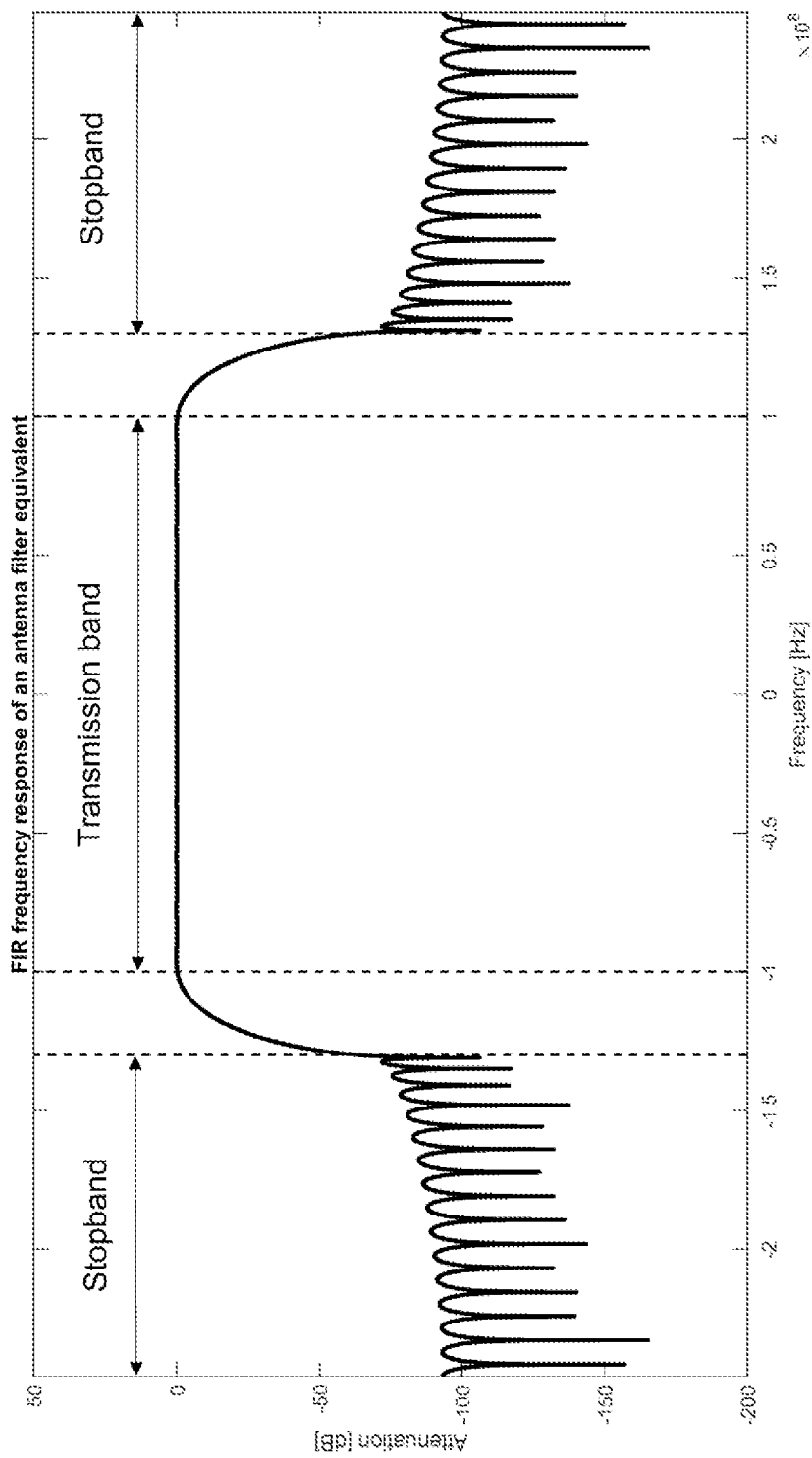
FIG. 11 shows an example FIR model for the frequency response of an antenna filter according to an example embodiment.

In particular, FIG. 1 illustrates the location of the antenna filter inside the transmission path, which can eliminate the CFR error deposited outside the transmission band. An example FIR model for the frequency response of an antenna filter is shown in FIG. 11. As shown, signal components at frequencies in the transmission band are passed through the filter, whereas signal components at frequencies within stopbands are blocked (or attenuated).

The antenna filter causes an increase of signal PAR, but this happens after the signal passes the power amplifier, so the increase of PAR does not result in additional signal distortion in the power amplifier.

Figure 12:
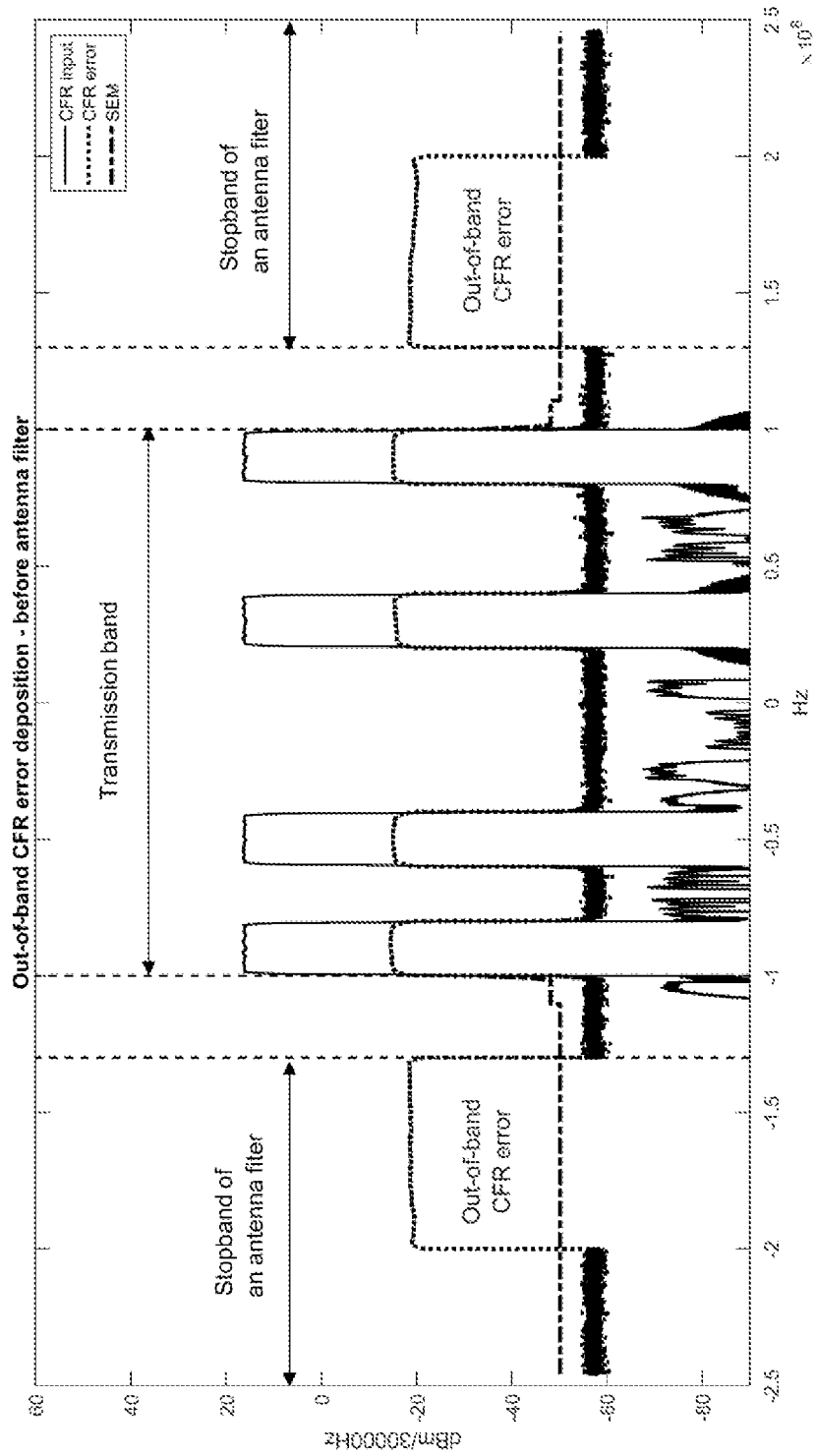
FIG. 12 shows the spectrum of a signal at the input to an antenna filter according to the example embodiment.
Figure 13:
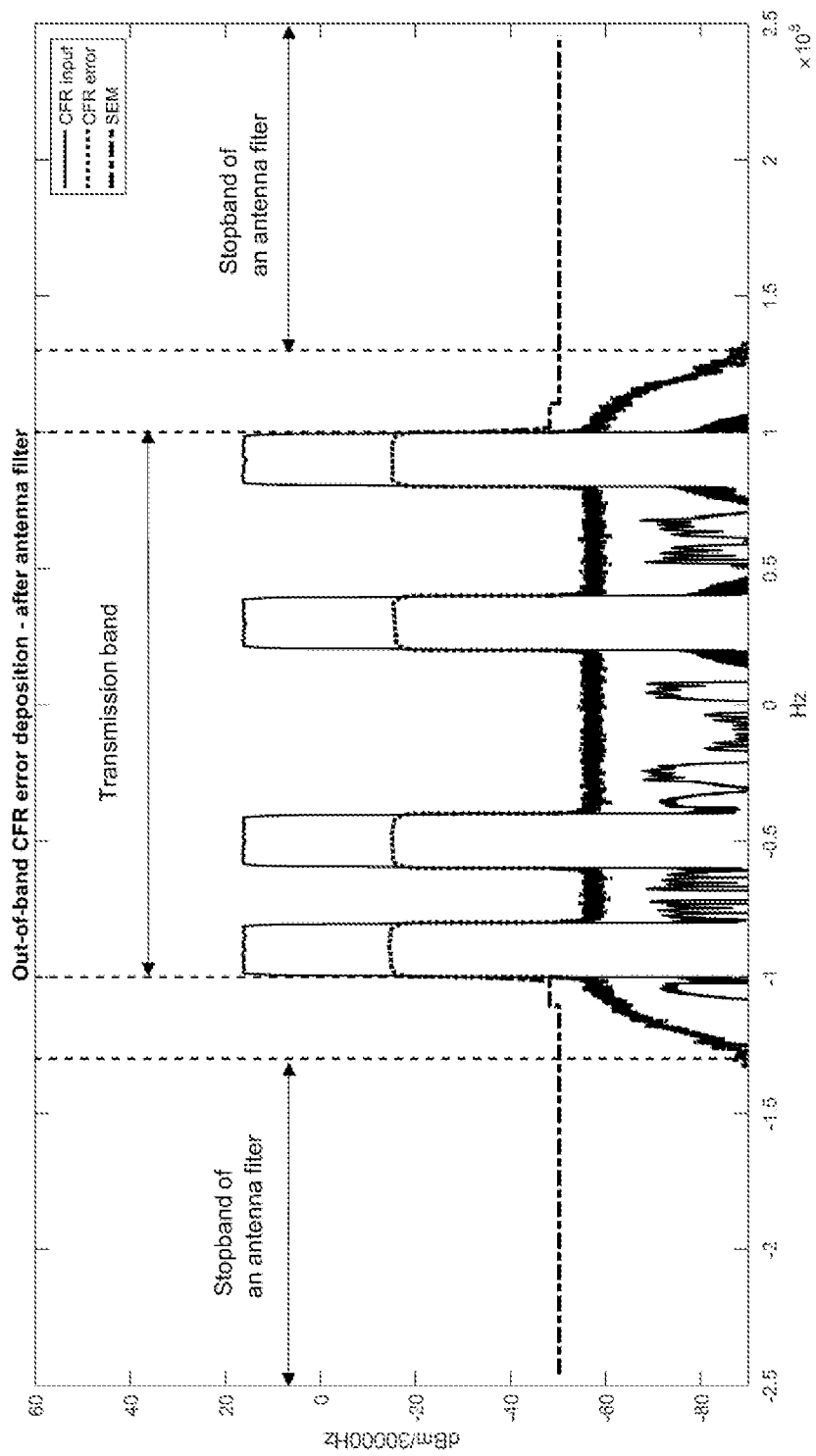
FIG. 13 shows the spectrum of the signal after passing through the antenna filter according to the example embodiment.

FIG. 12 and FIG. 13 illustrate how the spectrum of CFR error is changed when passing through the antenna filter.

In particular, FIG. 12 shows the spectrum of the signal at the input to the antenna filter. Depositing CFR error outside of the radio band allows reducing of the error interfering with the carriers but Spectral Emission Mask (SEM) is exceeded. FIG. 13 shows the spectrum of the signal after passing through the antenna filter. Out-of-band emissions are reduced below SEM.

Since the antenna filter barely provides surplus attenuation in the transition region between the transmission band and stopband, it is important that preferably no CFR error is placed in that region. It is noted that most challenging carrier arrangements, which require a highest PAR, benefit the most from the principle according to the present embodiment. In general, this invention lowers the required PAR and levels out the PAR requirement differences between the carrier arrangements.

As a result of considerably lowering the highest PAR requirements, the peak power capability of the PA can be significantly reduced and a much cheaper PA with a lower peak power capability and less power consumption can be utilized. This also requires less cooling effort.

Thus, as described above, a system of out-of-band CFR error deposition consists of two components working in tandem:

CFR algorithm capable of decreasing CFR error in the transmission band at the cost of producing out-of-band CFR error, Antenna filter placed between the power amplifier and transmitting antenna, capable of suppressing the out-of-band emissions caused by the CFR algorithm below the level required by regulators.

Thus, as described above in connection with FIG. 1, according to example embodiments, a CFR block 11 capable of out-of-band CFR error deposition and an antenna filter 14 to remove the out-of-band signal components produced by the CFR block 11 are provided.

In the following, the antenna filter is described in more detail. According to the present embodiment, the antenna filter is a band-pass filter or a multiple band-pass filter, with the following properties:

the passband of the filter contains the transmission band or multiple passbands containing multiple supported transmission bands the stopband of the filter provides attenuation to suppress out-of-band emissions produced in the system to the level required by regulators in some stopband frequency regions, the filter provides surplus attenuation to suppress high level of CFR error. These frequency regions are named the enhanced stopband.

In this connection, it is noted that in general, the provision of surplus attenuation cannot be avoided in an antenna filter. This is because the SEM mostly constitutes connected flat frequency responses, whereas any filter frequency response has a rather oscillating shape. Since both functions do not match, there is already surplus attenuation, which is a function of frequency and can be addressed by the dumping algorithm. Beyond that, the antenna filter can be tailored for CFR OOB noise dumping and provide enhanced stopband attenuation.

Figure 14:
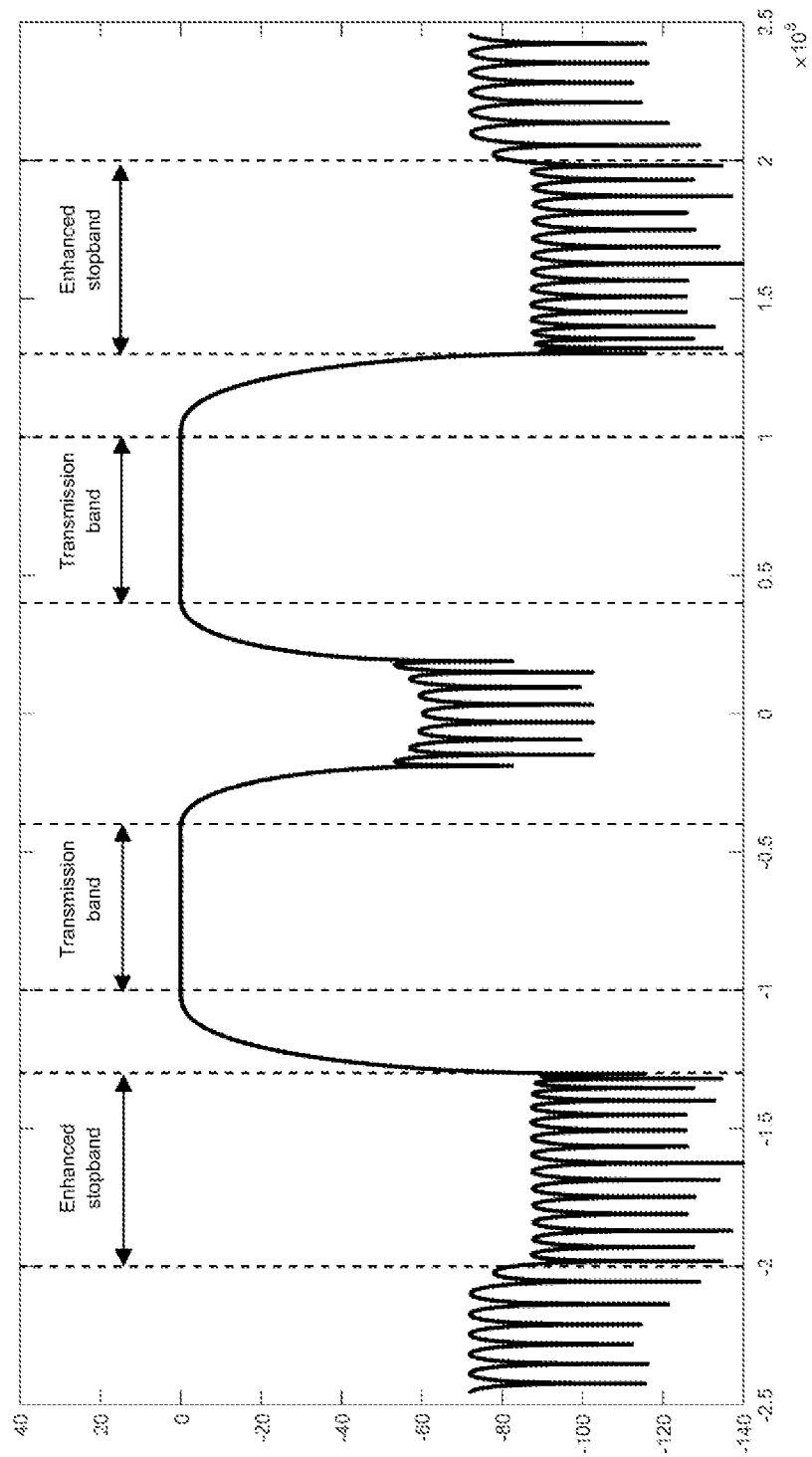
FIG. 14 shows an example for a desired frequency response of an antenna filter according to an example embodiment.

FIG. 14 shows an example for a desired frequency response of an antenna filter supporting out-of-band CFR error deposition in case of multiple band transmission. It is noted that FIG. 14 illustrates that case of a dual band antenna filter, i.e. there can be more than a single transmission band. Embodiments can handle multiple transmission bands as well.

The existing technology of producing analog antenna filters is sufficient to provide the filtering element required for some embodiments. In particular, most of the existing LTE or 5G base stations contain an antenna filter which can be used as-it-is for the purpose of the out-of-band CFR error deposition.

On the other hand, designing the antenna filter specifically for out-of-band CFR error deposition can provide even better performance, allowing higher amount of CFR error to be transferred out of the transmission band.

Figure 15:
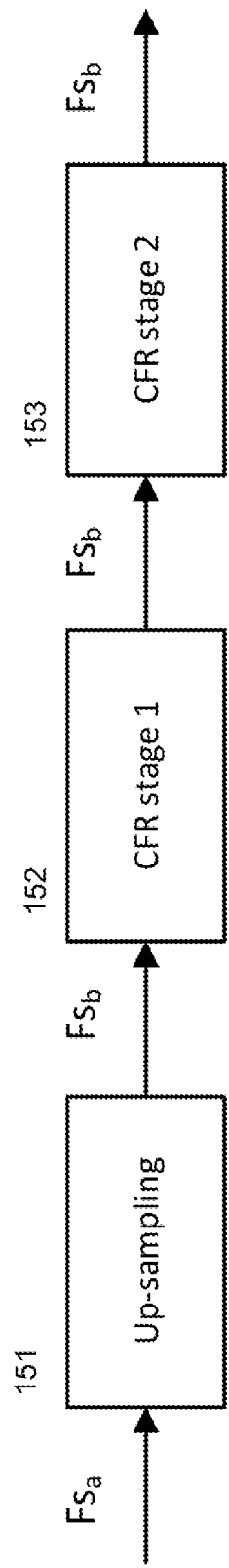
FIG. 15 shows two CFR stages 152 and 153 according to an example embodiment.

In the following, the CFR algorithm is described in more detail. The CFR algorithm can be realized as a series of blocks processing a digital signal, as shown in FIG. 15. FIG. 15 shows an example, in which two CFR stages 152 and 153 are chained to achieve a required performance. They can be preceded by an up-sampling block 151 providing sample rate required to contain out-of-band CFR error.

The input to CFR has a sample rate $Fs_a$ that allows containing all the transmission band. The up-sampling block is used to obtain a sample rate $Fs_b$ which allows to represent a higher bandwidth signal that contains CFR error outside the transmission band.

Optimum results are obtained when using a sample rate $Fs_b$ at least 2 times higher than required to cover the transmission band alone, so it can be assumed that usually $Fs_b \geq 2Fs_a$.

In case that the input of the CFR block already provides a sufficiently large sample rate to cover the bandwidth required for out-of-band CFR error deposition, the up-sampling block can be skipped.

The up-sampling block is followed by one or more CFR stages. Usually, 2 to 4 CFR stages are used, but higher numbers are also possible.

Figure 16:
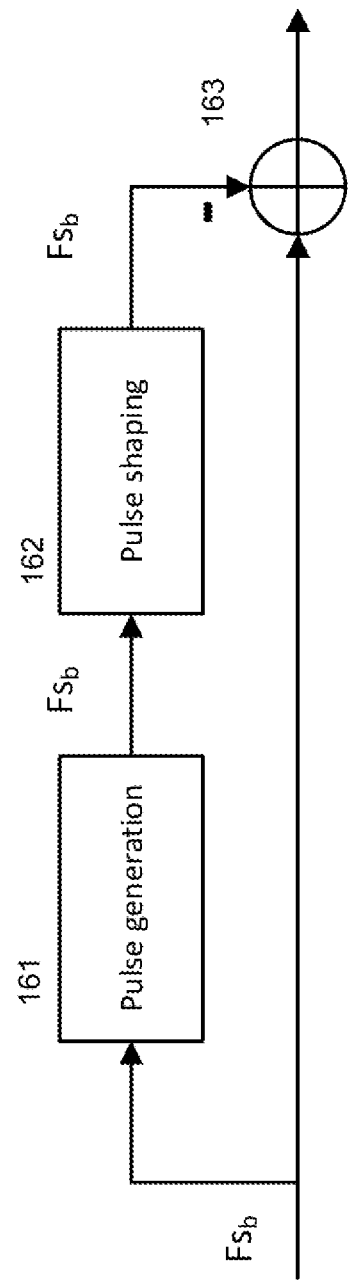
FIG. 16 shows an exemplary implementation of a CFR algorithm stage according to an example embodiment.

Each CFR stage 152, 153 can be implemented similarly as shown in FIG. 16, which shows an exemplary implementation of a CFR algorithm stage comprising a pulse generation block 161, a pulse shaping block 162 and a subtracting block 163.

In particular, a copy of the input signal is used to generate a series of clipping pulses in the pulse generation block 161. The pulses can be obtained by saturating the amplitude of the input signal of the pulse generation block at a desired threshold Th and subtracting the resulting signal from the input, as in the equation below.

output=input−sign(input)·min(|input|,*Th*)

The equation may also be expressed in complex notation as follows:

output=max(|input|−*Th*,0)·input/|input|' or output=input−min(*Th*,|input|)·input/|input|' or if input=0, output=0 (to avoid division by 0).

The pulse generation block 161 can internally use a multiple of the sample rate $Fs_b$ to identify accurately parts of the signal that exceed the threshold Th with a higher time resolution. The pulse generation block 161 may contain further processing which modify dynamically the number, amplitude, width of the pulses and may also allow for suppression of some pulses.

The output of the pulse generation block 161 is usually a wideband signal which does not meet spectrum requirements. Thus, it is followed by the pulse shaping block 162, which restricts the signal to dedicated frequencies:

the transmission band(s), range of frequencies outside of the transmission band(s) dedicated for depositing the CFR error.

There are many potential implementations of the Pulse shaping block, including but not restricted to:

a single digital filter, for example FIR, IIR or another filter, a multirate filtering system, e.g. FRM filter, a distributed filtering system of parallel acting digital filters dedicated for individual frequency resources (e.g. carriers or carrier parts), FFT based filtering.

By modifying the frequency response of the pulse shaping block 162, it is possible to modify the location of deposited CFR noise as well as the ratio between the amount of error deposited in the transmission band and out of this band. The frequency response is set to match the capabilities of the antenna filter to suppress the out-of-band emissions.

The frequency response of the pulse shaping blocks in different CFR stages does not have to be the same. In some cases, it is beneficial that certain CFR stages deposit the error only outside of the transmission band to better protect the transmission band. Similarly, the threshold Th can be varied stage by stage.

The general architecture of CFR stages can be used to construct many specific implementations, differing with the number of stages and properties of each CFR stage. The most important (but not the only) parameters describing a CFR stage are:

threshold Th used in the pulse generation block 161, frequency response of the pulse shaping block 162.

A higher number of CFR stages can provide better performance at the cost of increased complexity of the solution.

In the following, the performance of the solution is described. The performance of the solution depends on:

carrier arrangement, size and location of frequency regions where the out-of-band CFR error can be deposited, ability of the antenna filter to suppress a high level of out-of-band CFR error, performance of the CFR algorithm.

Single carrier arrangements provide the least challenge for any CFR algorithm. Similar performance as for single carrier can be achieved with any carrier arrangement of adjacent carriers having comparable power spectral densities. Multicarrier arrangements of non-adjacent carriers are the most challenging.

Out-of-band CFR error deposition provides the best results when CFR error can be located outside but close to the transmission band, extending the bandwidth of the CFR error 2-3 times compared to the transmission band alone.

A high number of CFR stages improves the CFR algorithm performance such that a larger number of stages allows for better utilization of the existing antenna filter's stopband attenuation at the price of increased complexity. Still, increasing the antenna filter's stop band attenuation improves the CFR performance already with the same number of stages. So it is two effects, which can be applied independently, but also together.

Two exemplary implementations of out-of-band CFR error deposition algorithm were evaluated and compared with state-of-the-art implementation.

Out-of-band CFR deposition algorithm with 4 CFR stages.

Out-of-band CFR deposition algorithm with 104 CFR stages.

The first implementation uses 4 CFR stages, the same number as in a state-of-the art implementation. Each CFR stage is using the same threshold Th and deposits the error both out-of-band and in the occupied transmission band. The frequency response of the pulse shaping block is the same in each CFR stage, as it is presented in FIG. 17. The response given in the figure is valid for the single carrier case, in the multicarrier case a similar response is used but scaled to a 200 MHz wide transmission bandwidth.

Figure 17:
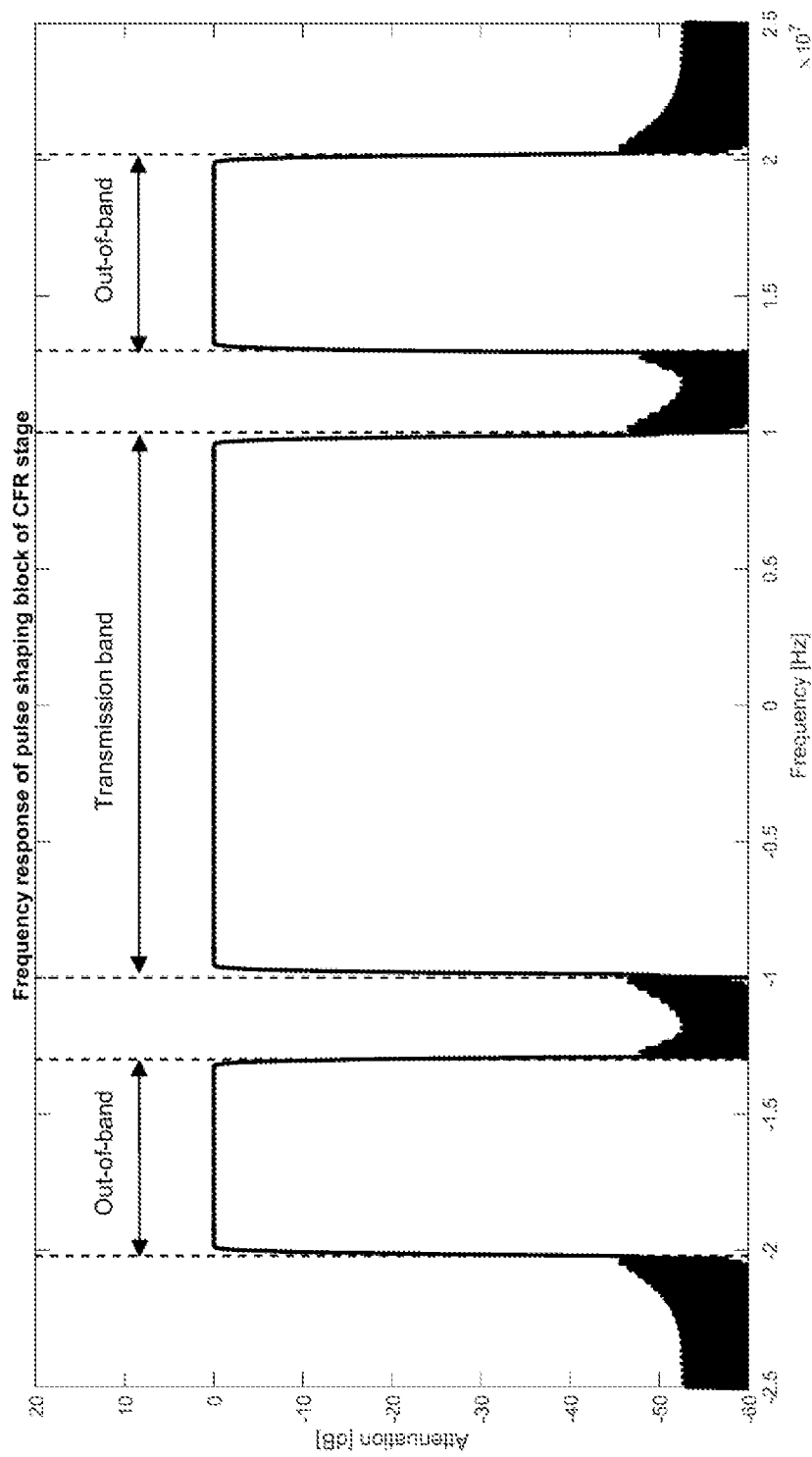
FIG. 17 shows the frequency response of the pulse shaping block in each CFR stage in a first implementation of the CFR algorithm according to an example embodiment.
Figure 18:
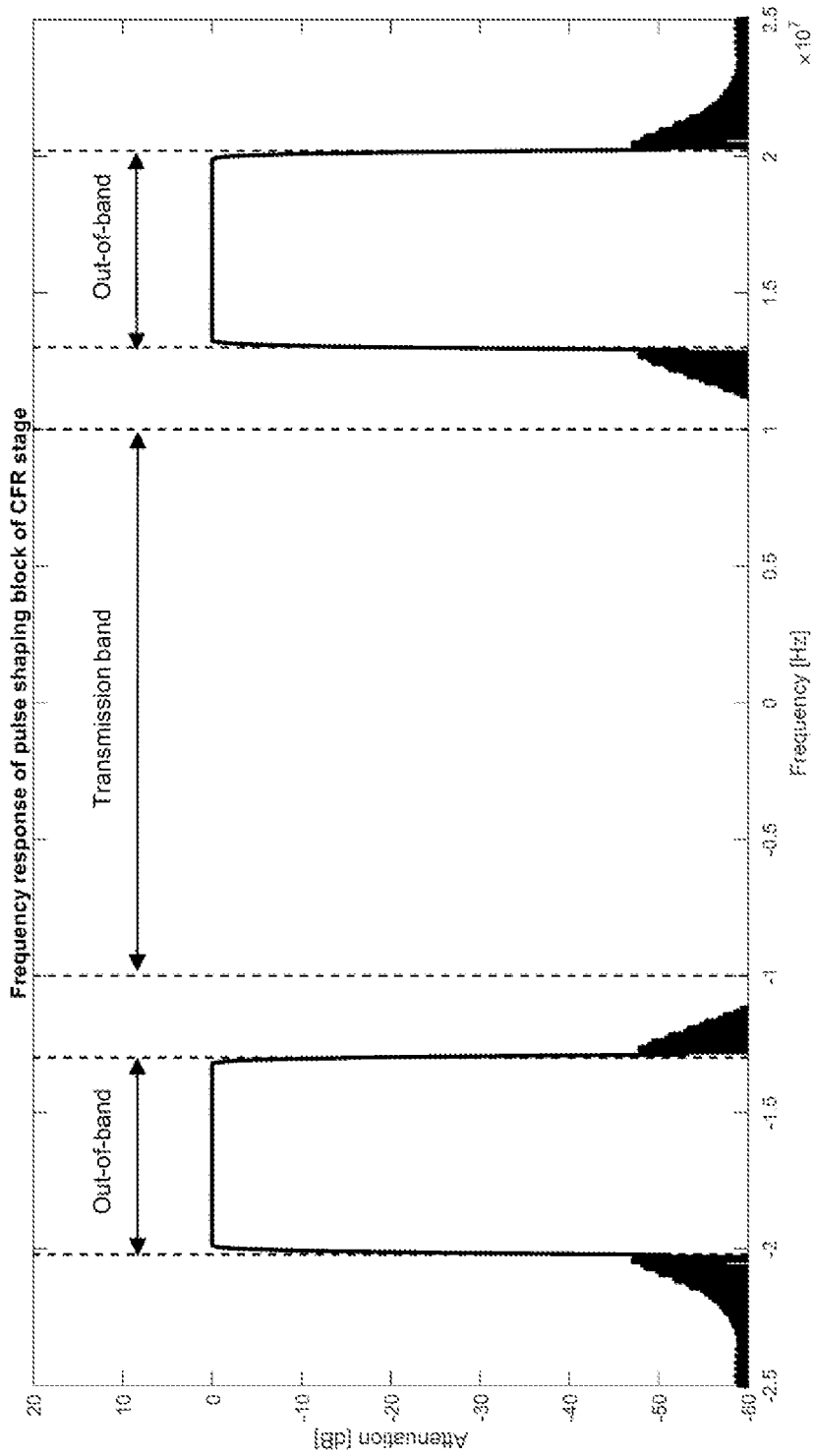
FIG. 18 shows the frequency response of the pulse shaping block used in the first 100 of the stages of a second implementation of the CFR algorithm according to an example embodiment.

The second implementation is given to investigate a potential performance improvement resulting from increasing the number of CFR stages. This implementation is built of:

100 CFR stages depositing the CFR error only out-of-band, as shown in FIG. 18, followed by 4 CFR stages depositing the CFR error both out-of-band and in the transmission band, as in FIG. 17.

All stages use the same threshold Th.

FIG. 18 mentioned above illustrates the frequency response of the pulse shaping block used in the first 100 of the stages of the second implementation of the CFR algorithm for OOB CFR error injection. This puts more emphasis on the OOB error components and may even boost the error in these frequency regions. The response given in the figure is valid for the single carrier case, in the multicarrier case a similar response is used but scaled to a 200 MHz wide transmission bandwidth.

An example performance of the solution was assessed for two carrier arrangements:

a single carrier LTE20 signal, a challenging arrangement of 4 LTE20 carriers placed within a 200 MHz transmission bandwidth.

In the first case, according to the present example embodiment, a single 20 MHz LTE carrier inside a 20 MHz transmission band and 40 MHz of bandwidth are available for containing the signal error. The obtained results should be representative for other similar configurations with a complete and contiguous occupation of the transmission band, as it may occur for LTE or 5G signals.

Figure 19:
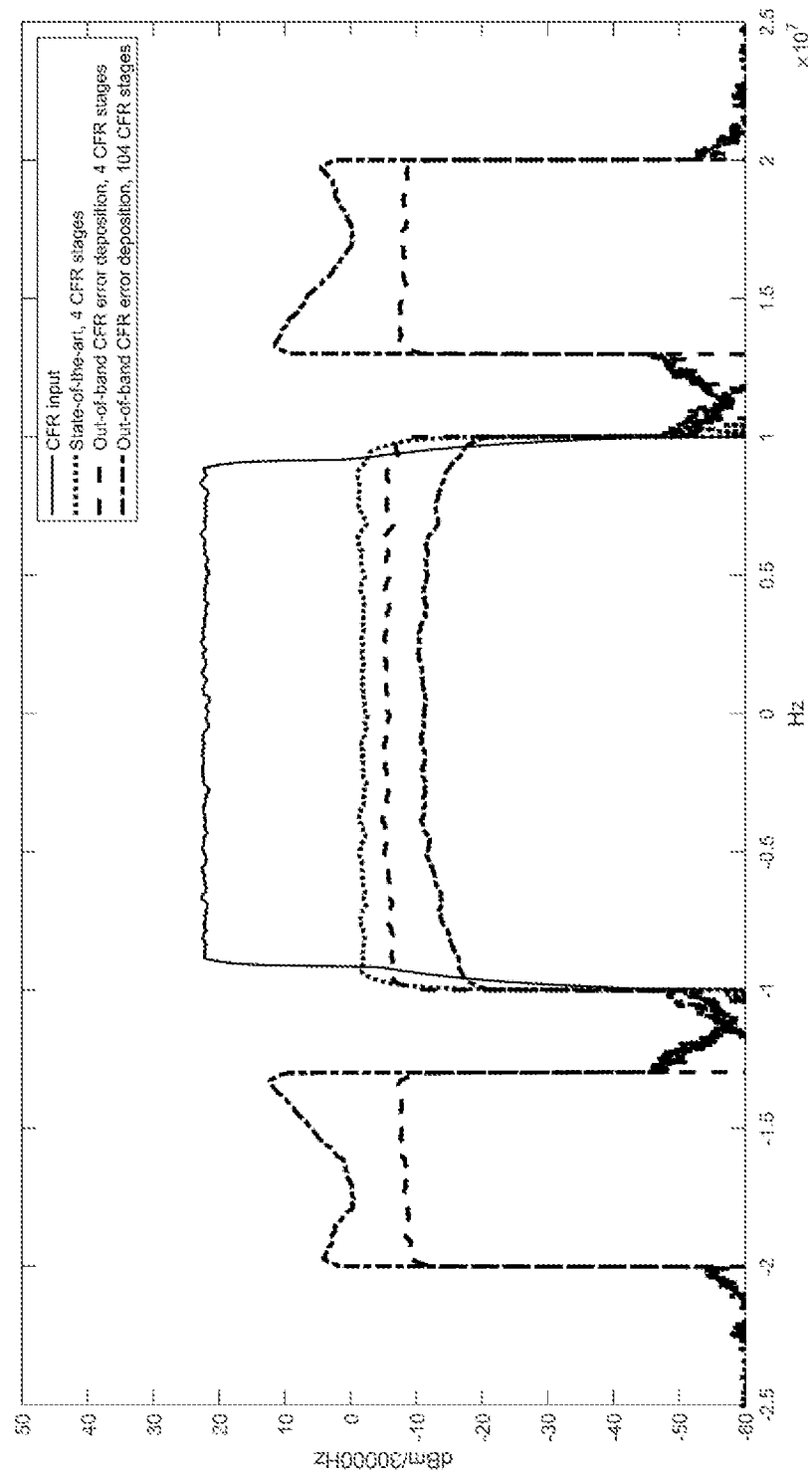
FIG. 19 illustrates the spectrum of a single 20 MHz LTE carrier and CFR error produced by a state-of-the-art CFR algorithm and two CFR algorithms according to example embodiments.

The resulting CFR error of the two implementations of the out-of-band CFR error deposition algorithm is visualized for the first carrier arrangement in FIG. 19 and compared with a state-of-the-art solution.

That is, FIG. 19 illustrates the spectrum of a single 20 MHz LTE carrier and CFR error produced by three CFR algorithms, namely by a prior art algorithm using 4 CFR stages, by the out-of-band CFR error deposition algorithm according to exemplary embodiments, one using 4 CFR stages and one using 104 CFR stage. As derivable from FIG. 19, the more CFR error is deposited outside of the transmission band, the lower the error inside. All algorithms are configured to produce signals of the same peak power.

Figure 20:
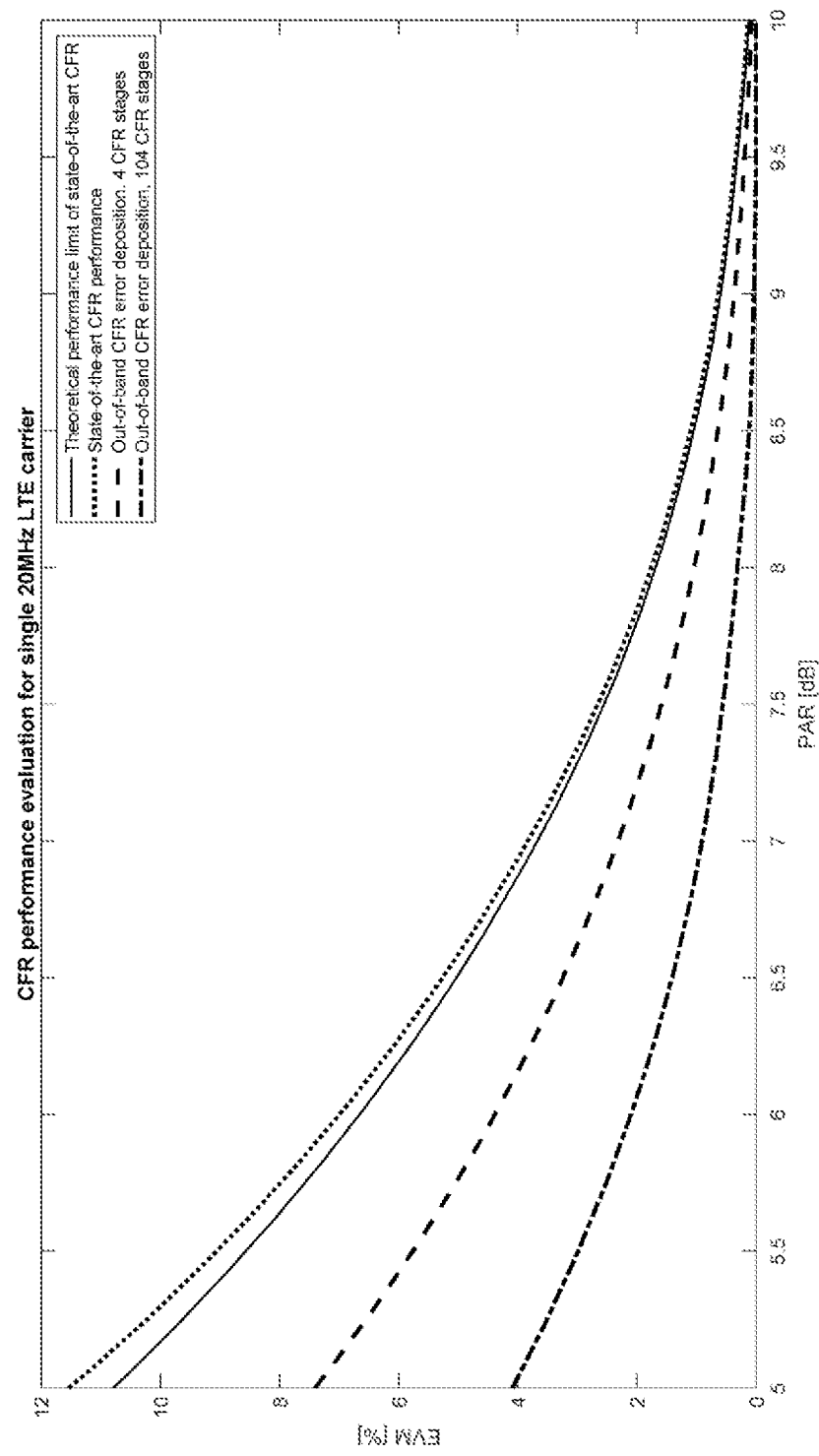
FIG. 20 illustrates the EVM obtained with the three algorithms shown in FIG. 19 for various levels of signal PAR.

FIG. 20 illustrates the EVM obtained with the three algorithms for various levels of signal PAR. In particular, FIG. 20 shows a comparison of CFR performance for a 20 MHz LTE input signal. EVM is calculated only for the range of frequencies corresponding to the transmitted carrier, so the out-of-band CFR error visible in FIG. 19 does not increase the EVM. It is noted that the dashed line in FIG. 20 is the "Theoretical state-of-the-art CFR performance limit".

Figure 21:
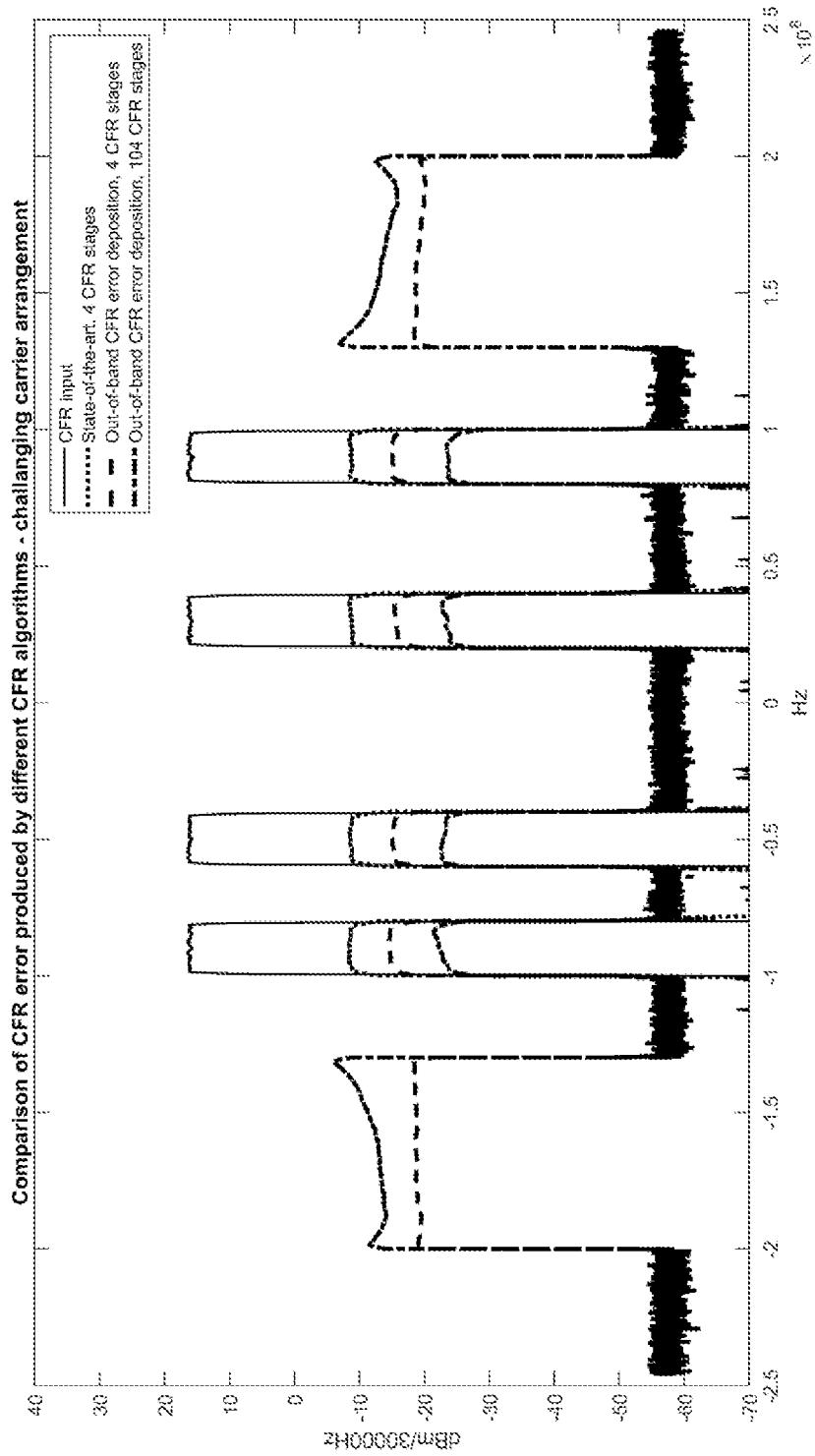
FIG. 21 illustrates the spectrum of four 20 MHz LTE carriers and the error generated by various CFR algorithms.

The second evaluated carrier arrangement is more challenging for any CFR algorithm and requires a higher PAR to achieve a desired level of EVM. FIG. 21 [FIG. 6-9] shows the difference in the distribution of CFR error between the two implementations of the out-of-band CFR error deposition algorithm and state-of-the art. To be more specific, FIG. 21 illustrates the spectrum of four 20 MHz LTE carriers and the error generated by various CFR algorithms.

Figure 22:
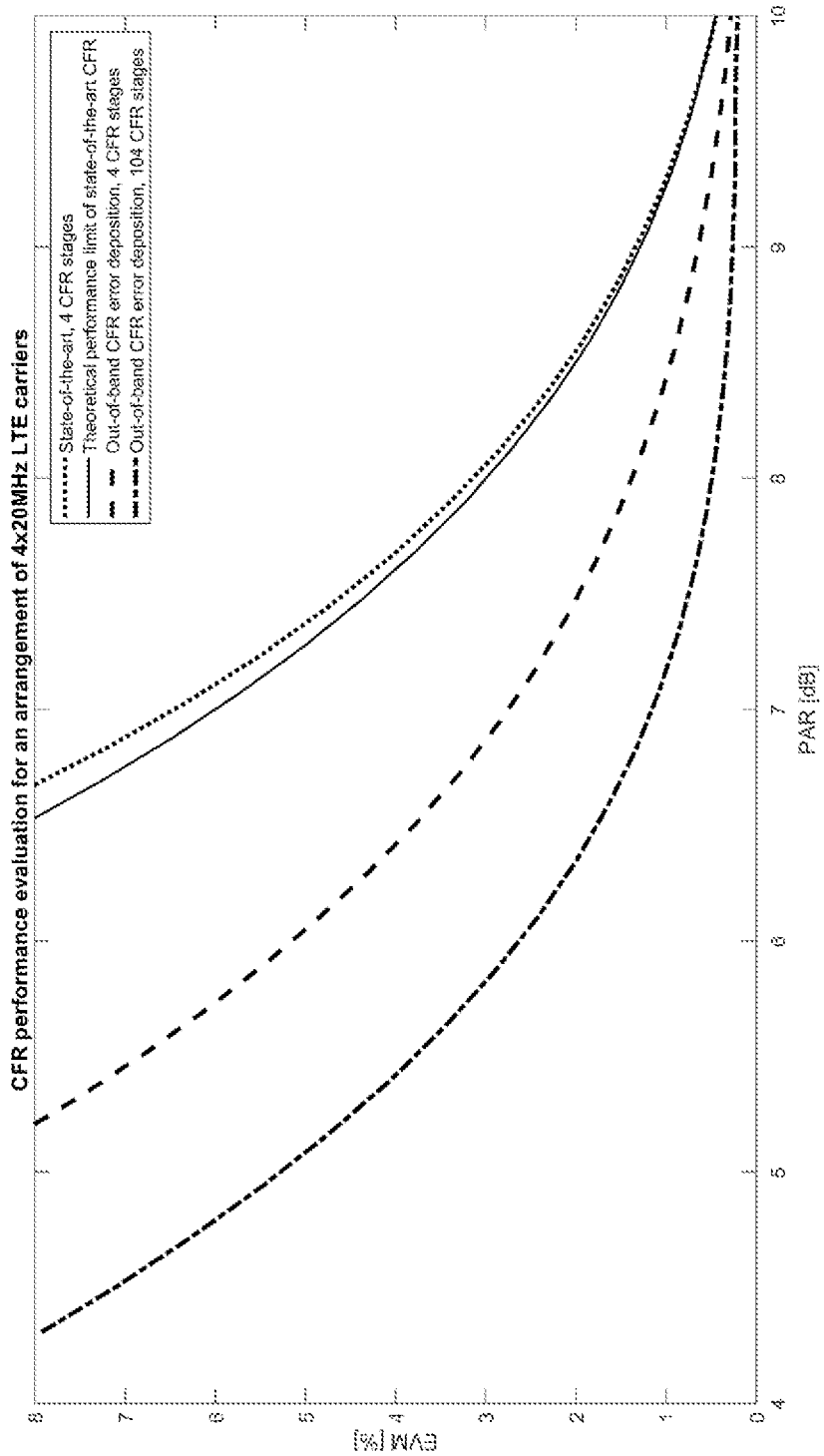
FIG. 22 shows the relation of EVM and PAR for the case of four 20 MHz LTE carriers.

The relation of EVM and PAR for the three evaluated CFR algorithms is given in FIG. 22. In particular, FIG. 22 shows the relation of EVM and PAR for the case of four 20 MHz LTE carriers. EVM is calculated only for the frequency regions occupied by the transmitted carriers. It is noted that, similar as in FIG. 20, the dashed line in FIG. 22 is the "Theoretical state-of-the-art CFR performance limit".

Presented results show that out-of-band CFR error deposition provides significantly better performance than state-of-the-art and its theoretical limit, which was already described above in connection with FIG. 9 [FIG. 3-3]. The improvement is visible both in case of a single carrier and in case of the challenging arrangement of four carriers.

Note that the state-of-the-art algorithm with 4 CFR stages performs close to the theoretical limit for algorithms that do not take advantage of out-of-band CFR error deposition, which implies that increasing the number of CFR stages will not provide a significant performance gain and is just approaching the performance to the theoretical limit.

In contrast to the state-of-the-art algorithm, the out-of-band CFR error deposition algorithm's performance according to exemplary embodiments increases significantly when increasing the number of CFR stages. Thus, making a compromise between algorithm complexity and performance is very important in case of this algorithm.

Figure 23:
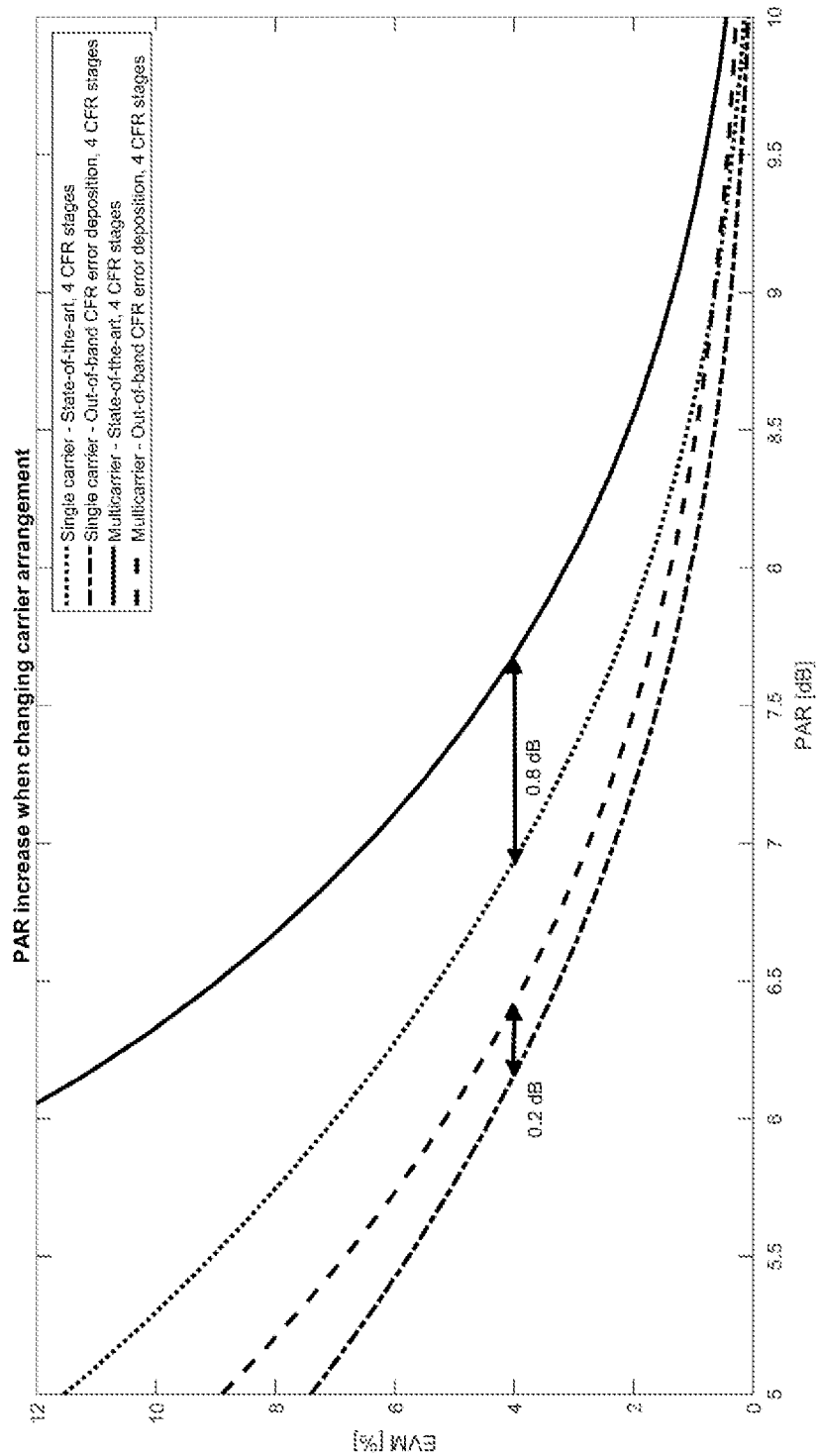
FIG. 23 illustrates a PAR increase when changing a carrier arrangement.

Changing a carrier arrangement from single carrier to multicarrier requires a PAR increase to achieve a desired EVM level in case of any considered algorithm, but the increase is lower in case of out-of-band CFR error deposition. As an example, as illustrated in FIG. 23, in case of the state-of-the-art algorithm, keeping EVM at the level of 4% requires increasing PAR by 0.8 dB from 6.9 dB to 7.7 dB. In case of the 4 stage out-of-band CFR error deposition algorithm, to keep EVM at the same level of 4% it is enough to increase PAR by 0.2 dB (6.2 dB→6.4 dB). It is another benefit of out-of-band CFR error deposition as it provides more stable performance when changing carrier arrangements.

In the following, a further example embodiment is described, according to which the available room for out-of-band emissions is quantified.

First, it is again referred to FIG. 1. As described above, FIG. 1 shows the radio transmitter comprising the CFR 11, the DAC 12, the power amplifier (PA) 13, the antenna filter 14 and the antenna 15. Moreover, a reference point A is defined between the CFR 11 and the DAC 12. A reference point B is defined between the power amplifier 13 and the antenna filter 14. A reference point C is defined between the antenna filter 14 and the antenna 15. Moreover, for simplicity, the power amplifier (PA) 13 is assumed to be linear. If however the PA behaves nonlinear, a DPD can be placed between CFR and DAC to linearize the PA. In the latter case, the linearity of the DPD-PA system is limited, and additional margin must be reserved to hold the unwanted spectral emissions of the DPD-PA system.

Figure 24:
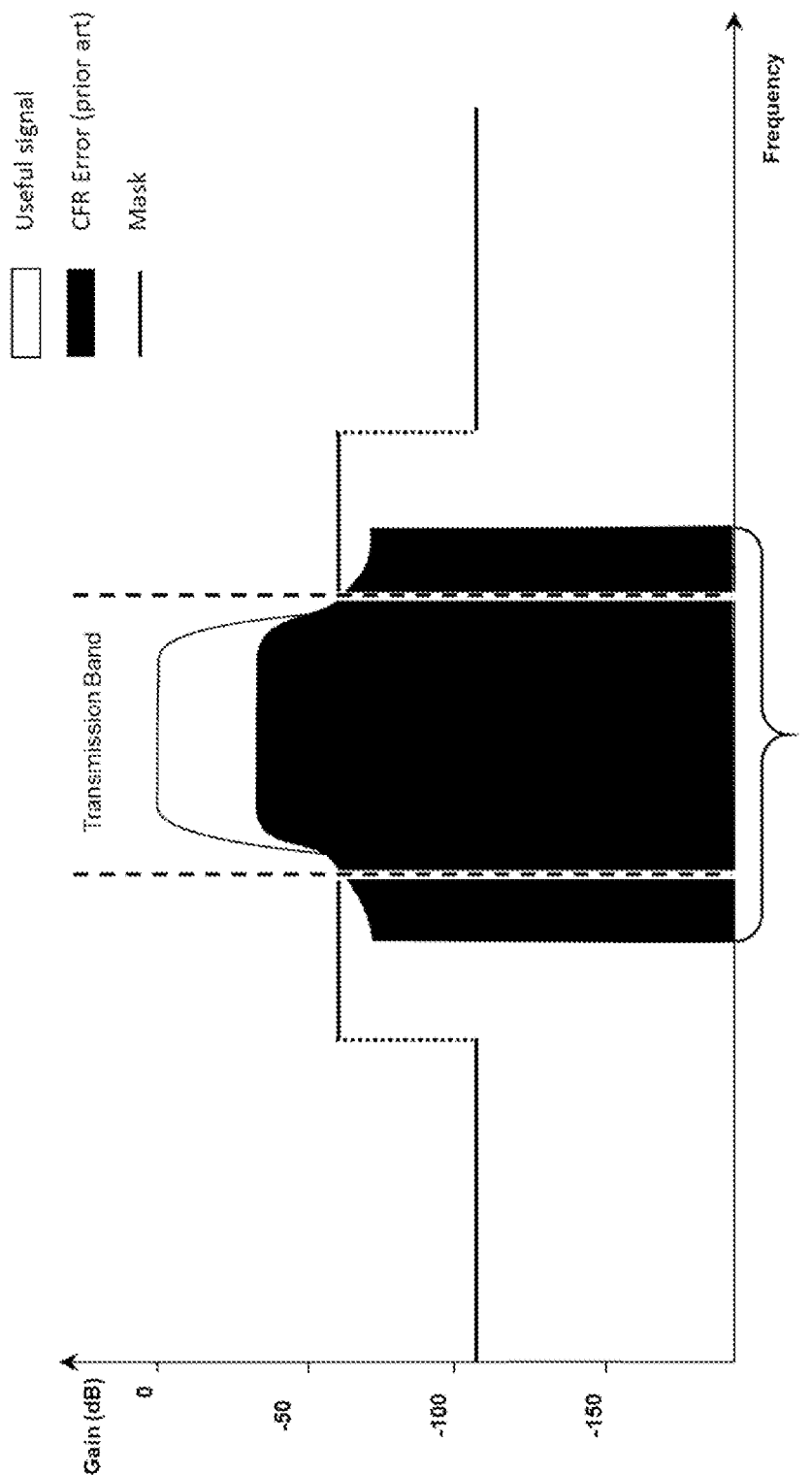
FIG. 24 shows an output spectrum of a prior-art CFR.

Before discussing measures according to the present exemplary embodiment, it is shortly referred to prior art measures. FIG. 24 shows an output spectrum of a prior-art CFR (e.g. CFR 31 shown in FIG. 3, the connection between CFR 31 and DAC 32 corresponds to reference point A in FIG. 1). It is noted that in FIG. 24, the signal powers and emission mask refer to the average carrier power spectral density and are expressed in dB. Please note that the clipping error is held in the carrier region in order not to interfere with other carriers from different operators or leak as an unwanted emission outside the transmission band. Prior-art CFR was basically focused on a frequency range (for example, a narrow frequency range) which barely exceeds the bandwidth of the transmission band.

Figure 25:
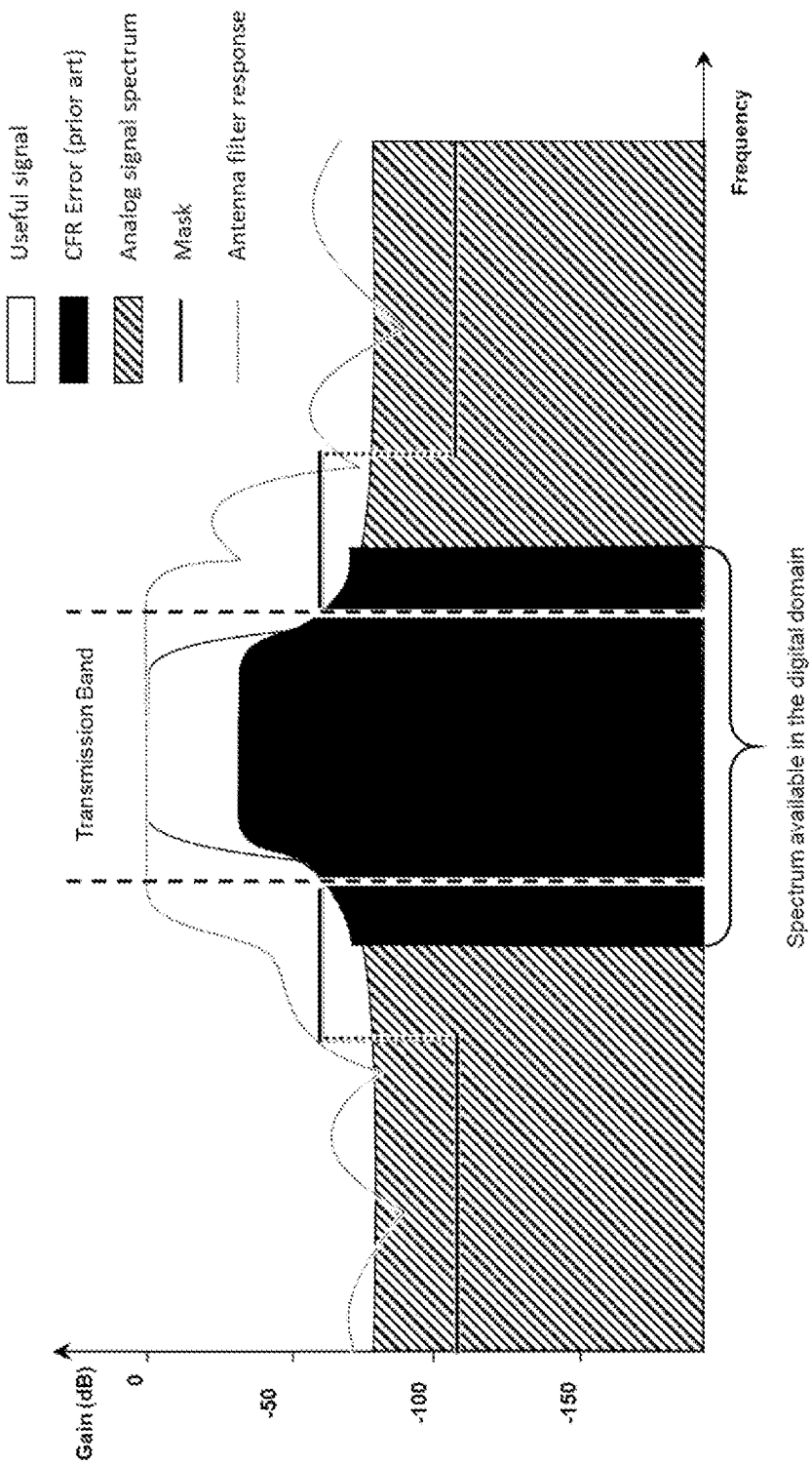
FIG. 25 illustrates a prior-art signal spectrum before an antenna filter.

After the CFR output (after DA conversion), the bandwidth of the signal is increased and reaches its full range before the antenna filter 33 (a point on the connection between the power amplifier 33 and the antenna filter 34 of FIG. 3 corresponds to reference point B in FIG. 11). The corresponding signals are illustrated in FIG. 25. It is noted that the signal powers and emission mask refer to the average carrier power spectral density and are expressed in dB.

Still, the frequency range outside the transmission band requires additional protection, which cannot be provided in the digital domain before the DAC. Hence, an antenna filter is required to provide additional attenuation. A typical antenna filter frequency response is shown in FIG. 25 as well.

Figure 26:
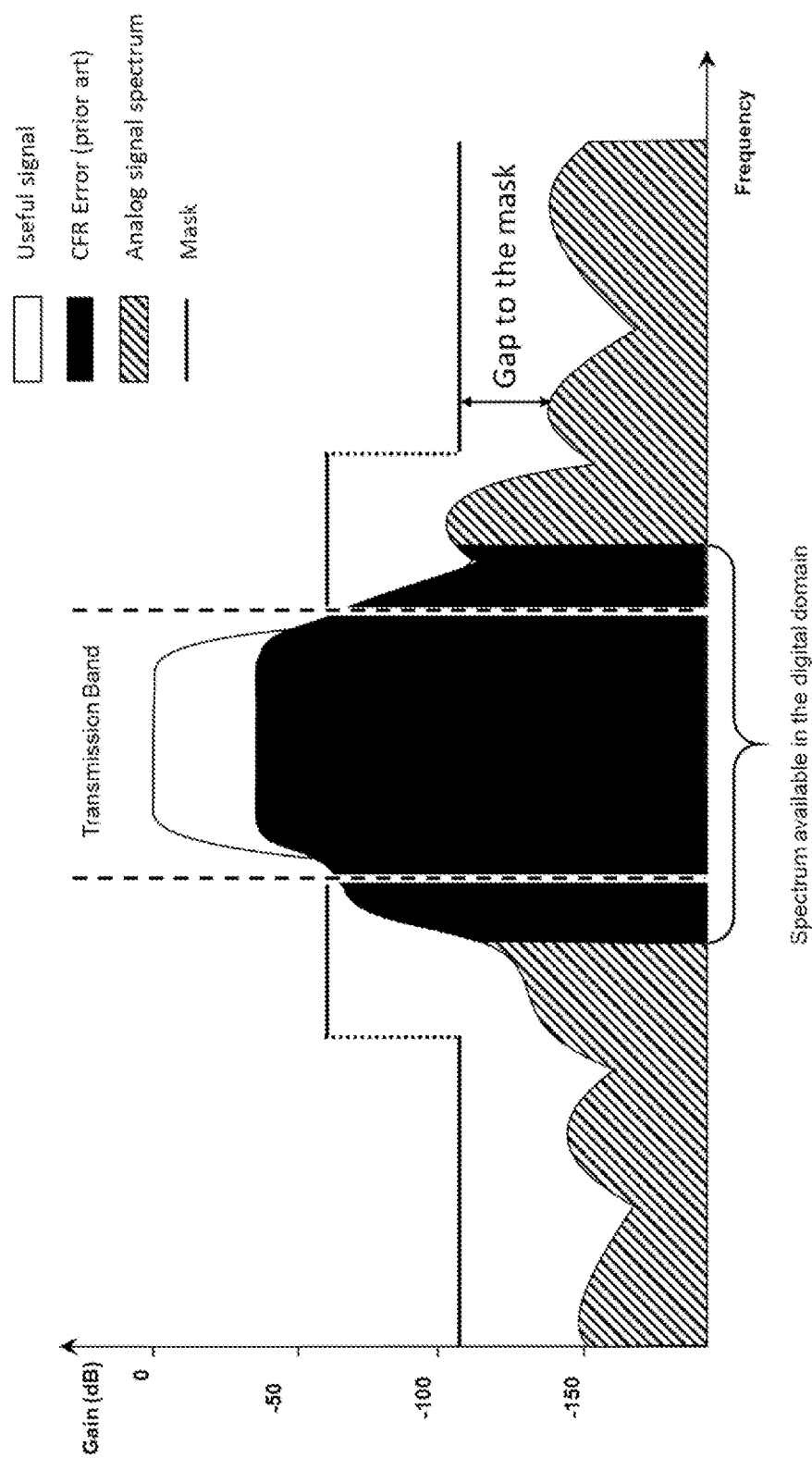
FIG. 26 shows an output of the antenna filter according to prior art.

The result after filtering (i.e., output of the antenna filter 34, this corresponds to reference point C in FIG. 1) is shown in FIG. 26. It is noted again that the signal powers and emission mask refer to the average carrier power spectral density and are expressed in dB.

In some frequency ranges, there is a large headroom available for unwanted emissions below the spectral mask. These frequency ranges have not been covered by prior-art CFR so far and are further away from the transmission band.

According to present exemplary embodiment, this headroom is utilized. A prerequisite for its utilization is the extension of the frequency range, which is covered by the CFR. Consequently, the CFR sample rate must be increased to extend the CFR's Nyquist zone, i.e., the zone or range of frequencies which can be perfectly reconstructed from the digital representation thereof based on the Nyquist-Shannon sampling theorem.

In order to quantify the available room for out-of-band emissions, the signal path is followed backwards from the last reference point C shown in FIG. 1.

Figure 27:
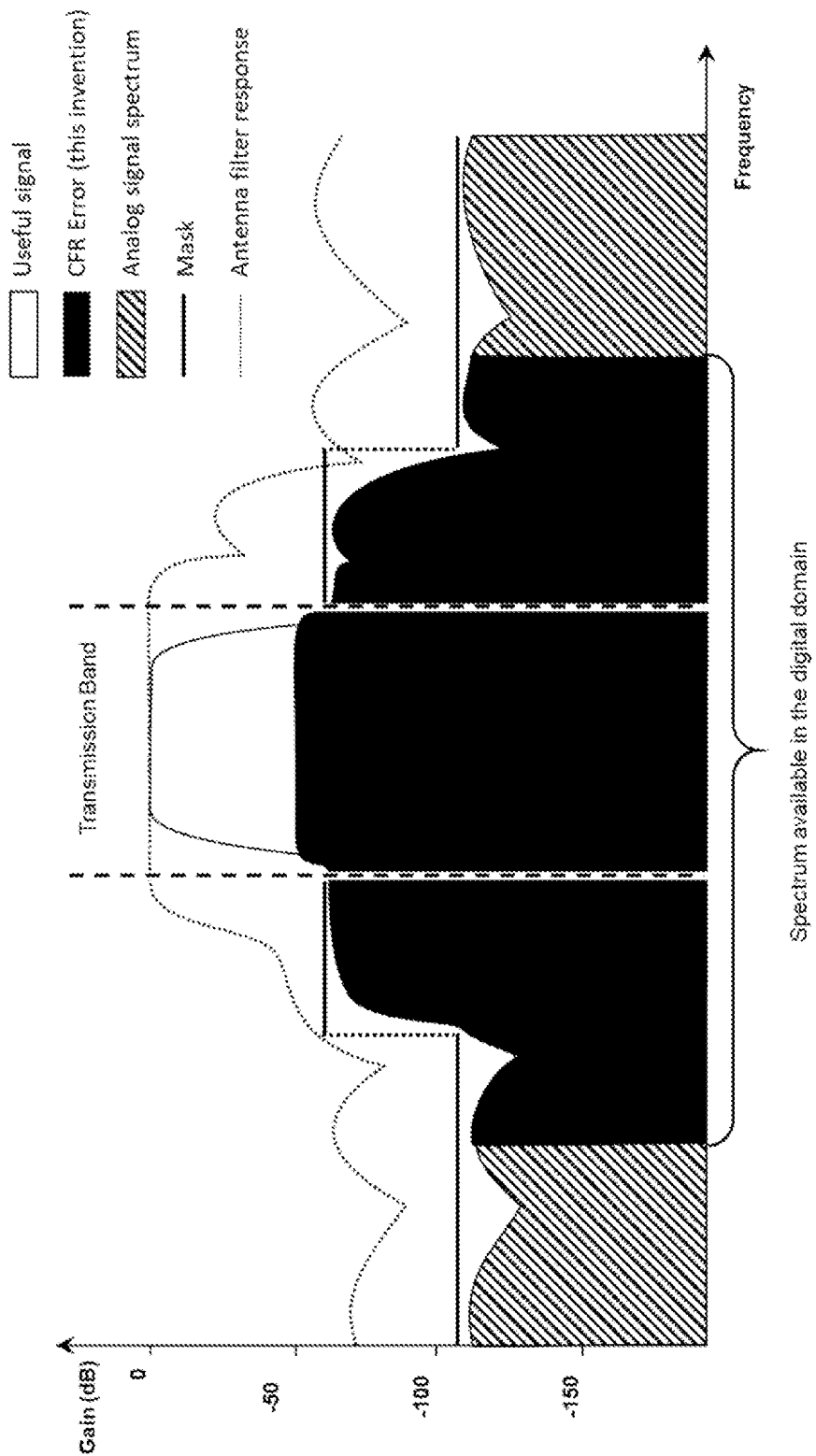
FIG. 27 illustrates the output of an antenna filter 14 according to an example embodiment.

FIG. 27 illustrates the output of the antenna filter 14 at reference point C. As derivable from FIG. 27, the spectral power is approaching closer to the emission limits, which are illustrated by the spectral mask. Still, some margin may be required for holding the unwanted emissions from the DPD-PA system.

Figure 28:
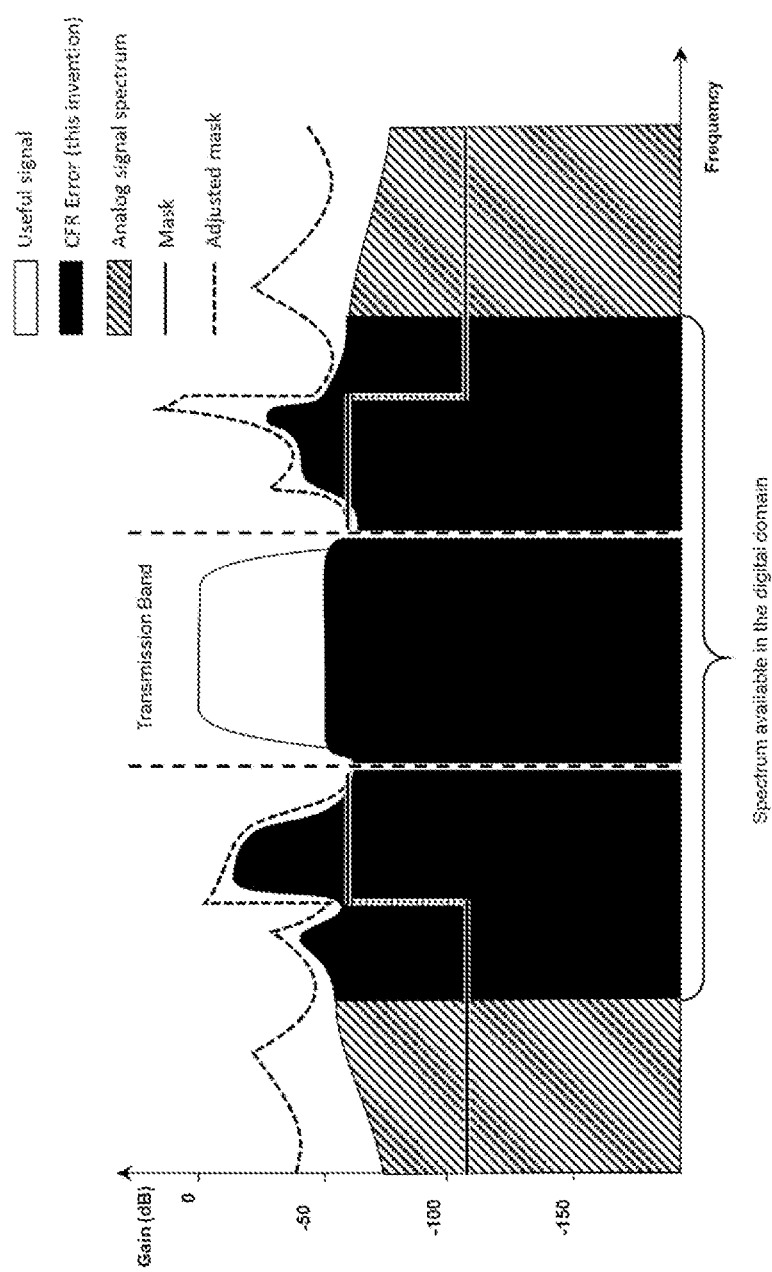
FIG. 28 shows the input of the antenna filter 14 according to the example embodiment.

After removing the attenuation from the antenna filter, the room for out-of-band noise dumping becomes visible in FIG. 28. FIG. 28 shows the input of the antenna filter 14 at reference point B shown in FIG. 1.

This room is addressed in the CFR for the deposition of the clipping error. The (virtual) sample rate is set to be large enough to cover at least a part of this frequency range.

Figure 29:
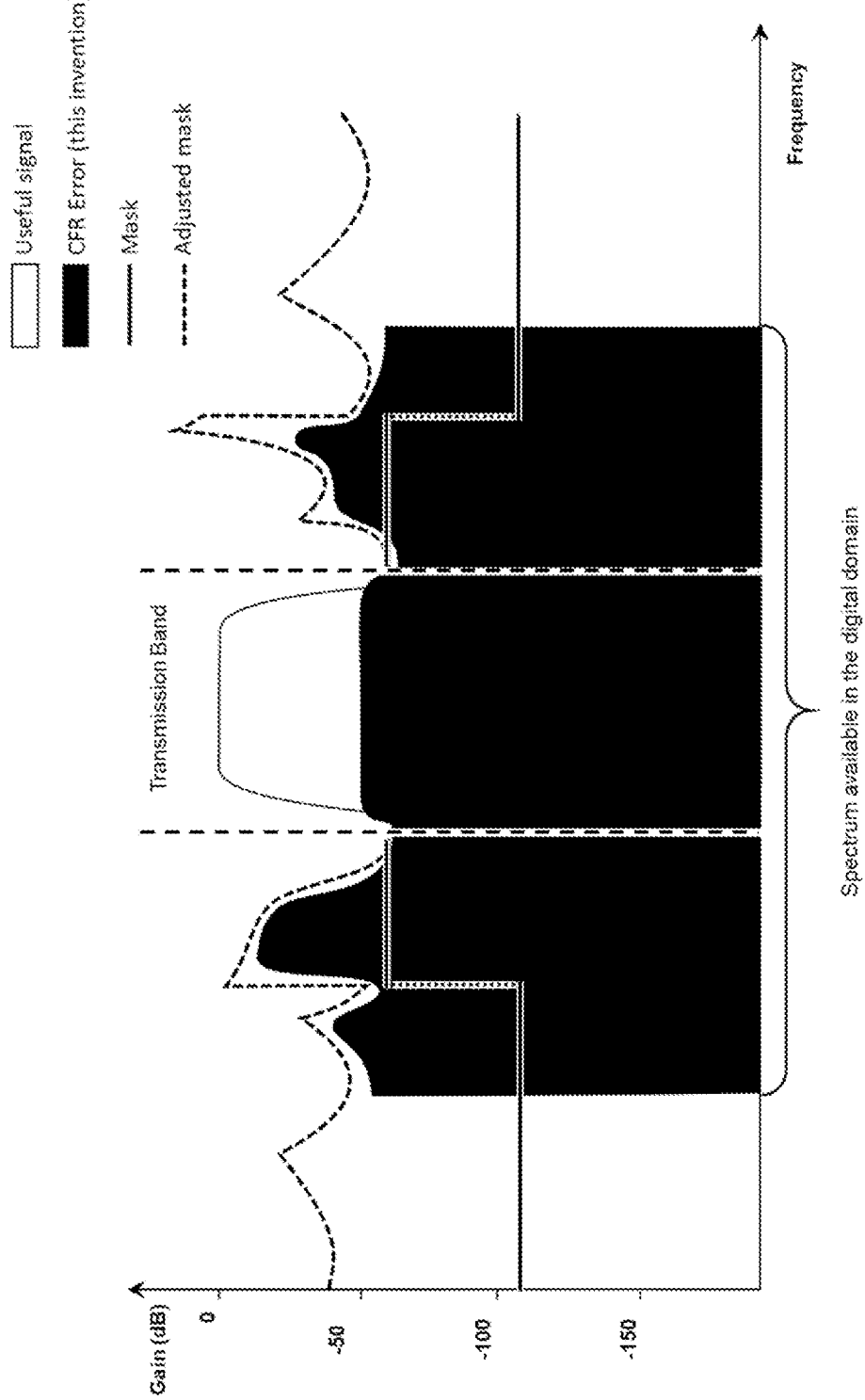
FIG. 29 illustrates the output of the CFR 11 according to the example embodiment.

The resulting situation is shown in FIG. 29, which illustrates the output of the CFR 11 at reference point A. In the (with respect to prior art) extended Nyquist zone, there is an additional frequency range available for noise dumping on either side of the transmission band.

The available room can be evaluated as $$\text{DumpingRoom\_dBm}(f) = \text{EmissionLimit\_dBm}(f) - \text{Margin\_dB}(f) - \text{AntennaFilterAttenuation\_dB}(f),$$

where

DumpingRoom_dBm(f) is the room available for noise dumping measured in dBm/Hz,
EmissionLimit_dBm(f) is the spectral mask emission limit measured in dBm/Hz,
Margin_dB(f) is the margin to the mask measured in dB,
AntennaFilterAttenuation_dB(f) is the antenna filter stop band attenuation measured in dB,
and all variables are functions of the frequency f.

It is noted that S25 in FIG. 2B described above shows an example for such an evaluation.

In order to refine the calculation of the available room, also the attenuation of the remaining parts in the radio transmitter may be considered.

The clipping error is spectrally shaped to not exceed DumpingRoom_dBm(f) at any frequency.

Hence, with respect to prior art (as described above in connection with FIGS. 25 to 27, for example), the CFR is considered to gain some room for clipping error deposition. Moreover, the sample rate is increased (if needed) to cover the frequency range of interest inside the CFR. Furthermore, the room for clipping error deposition is quantified as a function of the frequency in order to provide appropriate spectral shaping of the clipping error outside the transmission band. In addition, spectral shaping of the clipping error inside the CFR is performed such that a part or even all the clipping error is deposited outside the transmission band according with the available room there. Moreover, the option is considered that the antenna filter is specifically designed to further optimize the performance of the CFR.

Embodiments of the out-of-band CFR error deposition may be applied in base stations supporting GSM, WCDMA, LTE, NR (5G), future (6G and beyond) and other radio access technologies. The savings from the provision of a lower peak power are the most when the total radio power of power amplifier(s) is high, as it is the case for medium and wide range base stations but still significant in other cases, e.g. massive MIMO.

However, embodiments are also applicable to a transmitter of a user equipment for the uplink.

In the following, some benefits achievable by exemplary embodiments are described:

Obtaining the same level of EVM (and thus throughput) as with the state-of-the-art solution and lowering the output PAR allows:

a lower cost of the power amplifier,
a lower power consumption of the power amplifier,
a lower cost of the cooling system to dissipate thermal energy generated by the power amplifier,
a lower volume of a radio module,
a lower total cost of the radio module.

It is also possible to keep the PAR at the same level as with state-of-the-art solutions while decreasing the EVM. This results in higher throughput achieved with the same power amplifier as in case of a state-of-the-art CFR.

In addition, the "taming" of most challenging carrier arrangements reduces the need for providing additional power reduction for these carrier arrangements.

In case of a utilization inside a user equipment, the lowering of the required peak power capability, gained by this invention, directly translates to a longer battery lifetime in addition to the other benefits.

The above-described example embodiments are only examples and may be modified.

For example, the algorithmic approaches described above constitute just examples to achieve an appropriate spectral shaping of the clipping error for out-of-band noise dumping. There are different algorithms to favor dumping the clipping error out of the transmission band with different degrees of favorability. Dumping all the clipping error out of the transmission band can happen mostly for higher order modulation schemes with little amount of error to dump, which is related to PAR of around 9 dB.

Figure 30:
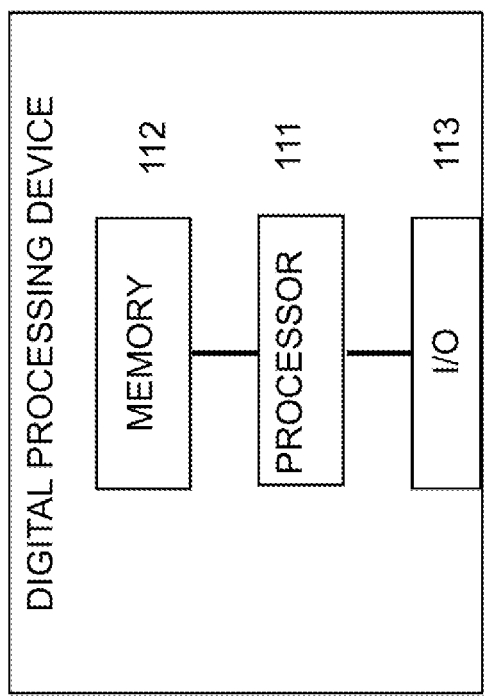
FIG. 30 shows an example for the structure of a digital processing device (for example, CFR 11) according to an example embodiment.

Furthermore, the digital processing device 1 for carrying out the procedures as described above in connection with FIG. 2 may have a structure as shown in FIG. 30. In particular, the digital processing device 1 comprises at least one processor 11 and at least one memory 12 including computer program code. The at least one processor 11, with the at least one memory 12 and the computer program code, is configured to cause the digital processing device to perform the processes as described above in connection with FIG. 2, for example.

The digital processing device 11 may further comprise an I/O unit 13, which is capable of transmitting to and receiving from other elements (e.g., DAC 12).

The functions carried out by the digital processing device 1 (i.e., the processor 11) may be carried out by software. For example, a pre-calculation for the frequency response may be carried out to obtain (by state-of-the-art methods) a corresponding filter to shape the CFR error accordingly. This needs to be done before a new carrier constellation is set up and usually is performed by software.

Moreover, permanent shaping of the CFR error from the current RF signal may be performed inside an ASIC or FPGA. Software (run on a general processing device comprising a CPU etc.) is usually too slow to do this but cannot be excluded.

Names of network elements, protocols, and methods are based on current standards. In other versions or other technologies, the names of these network elements and/or protocols and/or methods may be different, as long as they provide a corresponding functionality.

In general, the example embodiments may be implemented by computer software stored in the memory (memory resources, memory circuitry) 12 and executable by the processor (processing resources, processing circuitry) 11 or by hardware, or by a combination of software and/or firmware and hardware.

As used in this application, the term "circuitry" refers to all of the following:
(a) hardware-only circuit implementations (such as implementations in only analog and/or digital circuitry) and
(b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and
(c) to circuits, such as a microprocessor(s) or a portion of a microprocessor(s), that require software or firmware for operation, even if the software or firmware is not physically present.

This definition of "circuitry" applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and printed electrical connections, as well as by the use of electromagnetic energy, such as electromagnetic energy having wavelengths in the radio frequency region, the microwave region and the optical (both visible and invisible) region, as non-limiting examples.

The memory (memory resources, memory circuitry) 12 may be of any type suitable to the local technical environment and may be implemented using any suitable data storage technology, such as semiconductor based memory devices, magnetic memory devices and systems, optical memory devices and systems, fixed memory and removable memory, and non-transitory computer-readable media. The processor (processing resources, processing circuitry) 301 may be of any type suitable to the local technical environment, and may include one or more of general purpose computers, special purpose computers, microprocessors, digital signal processors (DSPs) and processors based on a multi core processor architecture, as non-limiting examples.

It is to be understood that the above description is illustrative of the invention and is not to be construed as limiting the invention. Various modifications and applications may occur to those skilled in the art without departing from the true spirit and scope of the invention as defined by the appended claims.

The invention claimed is:

1. An apparatus, comprising:
at least one processor; and
at least one memory including computer program code, the at least one memory and computer program code configure to cause the apparatus to
generate a digital transmission signal;
convert the digital transmission signal into an analog transmission signal;
amplify the analog transmission signal;
filter the amplified analog transmission signal, and to pass frequencies in at least one passband and to attenuate frequencies in at least one stopband;
reduce peak power in the digital transmission signal, wherein error components having different frequencies are produced; and
manipulate a frequency spectrum of the error components such that at least a part of the error components is deposited in the at least one stopband.

2. The apparatus according to claim 1, wherein the at least one memory and computer program code are further configured, with the at least one processor, to apply, as the process of reducing peak power, a crest factor reduction algorithm.

3. The apparatus according to claim 2, wherein the at least one memory and computer program code are further configured, with the at least one processor, to apply, in the crest factor reduction algorithm, a predefined threshold for reducing the peak power and a predefined frequency response for manipulating the frequency spectrum of the error components.

4. The apparatus according to claim 2, wherein the crest factor reduction algorithm comprises at least one crest factor reduction stage, each crest factor reduction stage being configured to
clip the amplitude of an input signal based on the threshold;
restrict a frequency of an output signal to frequencies of the at least one passband and the at least one stopband based on the predefined frequency response; and
subtract the output signal from the input signal.

5. The apparatus according to claim 4, wherein a plurality of crest factor reduction stages are provided in series.

6. The apparatus according to claim 5, wherein for each of the plurality of crest factor reduction stages, a same predefined threshold and/or the same predefined frequency response are applied, or different predefined thresholds and/or different predefined frequency responses are applied.

7. The apparatus according to claim 4, wherein the at least one memory and computer program code are further configured to up-sample the digital transmission signal and to provide the up-sampled digital transmission signal as the input signal of the crest factor reduction stage or to the first one of a series connection of the crest factor reduction stages, wherein the sample rate raised during the up-sampling is used in all crest factor reduction stages and for the signal transmission.

8. The apparatus according to claim 1, wherein a plurality of stopbands are provided, and
the at least one memory and computer program code are further configured, with the at least one processor, to attenuate the frequencies more strongly in at least one of the stopbands, which is defined as an enhanced stopband, than in other stopbands, and wherein
the apparatus configured to dispose a higher level of error components in the enhanced stopband than in other stopbands which are not enhanced stopbands.

9. The apparatus according to claim 8, wherein the at least one memory and computer program code are further configured, with the at least one processor, to attenuate frequencies in the at least one enhanced stopband with respect to frequencies in other stopbands which are not enhanced stopbands.

10. The apparatus according to claim 1, wherein a transition region is defined between the at least one passband and the at least one stopband, and the apparatus is configured to deposit no error components in the transition region.

11. The apparatus according to claim 1, further comprising an antenna, wherein the antenna is configured to receive the analog transmission signal output.

12. The apparatus according to claim 1, wherein the at least one memory and computer program code is further configured, with the at least one processor, to determine an available room for depositing error components based on a spectral mask emission limit, a margin to the mask, and/or an antenna filter stopband attenuation measured in dB and is a function of the frequency f, and to
manipulate the frequency spectrum of the error components such that the error components do not exceed the determined available room at any frequency.

13. The apparatus according to claim 12, wherein
an available room for depositing error components is determined based on the following formula:

DumpingRoom_dBm($f$)=EmissionLimit_dBm($f$)−Margin_dB($f$)−AntennaFilterAttenuation_dB($f$), wherein DumpingRoom_dBm(f) is the room available for depositing error components measured in dBm/Hz and is a function of the frequency f,
EmissionLimit_dBm(f) is the spectral mask emission limit measured in dBm/Hz and is a function of the frequency f,
Margin_dB(f) is the margin to the mask measured in dB and is a function of the frequency f, and
AntennaFilterAttenuation_dB(f) is the antenna filter stopband attenuation measured in dB and is a function of the frequency f, and
wherein the at least one memory and computer program code is configured to manipulate the frequency spectrum of the error components such that the error components do not exceed DumpingRoom_dBm(f) at any frequency.

14. The apparatus according to claim 12, wherein the at least one memory and computer program code are further configured, with the at least one processor, to determine the available room for depositing error components also by considering an attenuation of the power amplification.

15. The apparatus according to claim 1, wherein the at least one memory and computer program code are further configured, with the at least one processor, to obtain a frequency response for manipulating a frequency spectrum of the error components from the frequency response of the antenna, the frequency response of the apparatus.

16. The apparatus according to claim 1, wherein the at least one passband corresponds to at least one carrier having a predetermined bandwidth.

17. The apparatus according to claim 1, wherein the at least one memory and computer program code are further configured, with the at least one processor, to determine the amount of the error components in a certain frequency range of the antenna filter's stopband as a function of the position of the frequency range.

18. The apparatus according to claim 1, wherein the at least one memory and computer program code are further configured, with the at least one processor, to attenuate frequencies in the at least one stopband with respect to frequencies passed in the at least one passband.

19. A base station comprising an apparatus according to claim 1.

20. A mobile device comprising an apparatus according to claim 1.

21. A method, comprising:
generating a digital transmission signal;
converting the digital transmission signal into an analog transmission signal;
amplifying the analog transmission signal;
filtering the amplified analog transmission signal, and passing frequencies in at least one passband, and to attenuating frequencies in at least one stopband;
reducing peak power in the digital transmission signal, wherein error components having different frequencies are produced; and
manipulating a frequency spectrum of the error components such that at least a part of the error components is deposited in the at least one stopband of the antenna filter.

22. The method according to claim 21, further comprising applying, as the process of reducing peak power, a crest factor reduction algorithm.

23. The method according to claim 21, wherein a plurality of stopbands are provided, and the method further comprises the frequencies more strongly in at least one of the stopbands, which is defined as an enhanced stopband, than in the other stopbands; and
disposing a higher level of error components in the enhanced stopband than in other stopbands which are not enhanced stopbands.

24. The method according to claim 23, wherein further comprising attenuating frequencies in the at least one enhanced stopband with respect to frequencies in other stopbands which are not enhanced stopbands.

25. The method according to claim 21, wherein a transition region is defined between the at least one passband and the at least one stopband, the method further comprising
depositing no error components in the transition region.

26. The method according to claim 22, further comprising applying, in the crest factor reduction algorithm, a predefined threshold for reducing the peak power and a predefined frequency response for manipulating the frequency spectrum of the error components.

27. The method according to claim 22, wherein the crest factor reduction algorithm comprises at least one crest factor reduction stage, each crest factor reduction stage including
clipping the amplitude of an input signal based on the threshold;
restricting the frequency of an output signal to frequencies of the at least one passband and the at least one stopband based on the predefined frequency response; and
subtracting the output signal from the input signal.

28. The method according to claim 27, wherein a plurality of crest factor reduction stages are provides in series.

29. The method according to claim 28, wherein for each of the plurality of crest factor reduction stages, the same predefined threshold and/or the same predefined frequency response are applied, or different predefined thresholds and/or different predefined frequency responses are applied.

30. The method according to claim 27, wherein the crest factor reduction algorithm further comprises up-sampling the digital transmission signal, and providing the up-sampled digital transmission signal as the input signal of the crest factor reduction stage or to the first one of a series connection of the crest factor reduction stages, wherein the sample rate raised during the up-sampling is used in all crest factor reduction stages and for the signal.

31. The method according to claim 21, further comprising
determining an available room for depositing error components based on a spectral mask emission limit, a margin to the mask, and/or an antenna filter stopband attenuation measured in dB and is a function of the frequency f, and
manipulating the frequency spectrum of the error components such that the error components do not exceed the determined available room at any frequency.

32. The method according to claim 31, wherein
an available room for depositing error components is determined based on the following formula:

$$\text{DumpingRoom\_dBm}(f) = \text{EmissionLimit\_dBm}(f) - \text{Margin\_dB}(f) - \text{AntennaFilterAttenuation\_dB}(f),$$

wherein

DumpingRoom_dBm(f) is the room available for depositing error components measured in dBm/Hz and is a function of the frequency f,
EmissionLimit_dBm(f) is the spectral mask emission limit measured in dBm/Hz and is a function of the frequency f,
Margin_dB(f) is the margin to the mask measured in dB and is a function of the frequency f, and
AntennaFilterAttenuation_dB(f) is the antenna filter stopband attenuation measured in dB and is a function of the frequency f, and
the method further comprises manipulating the frequency spectrum of the error components such that the error components do not exceed DumpingRoom_dBm(f) at any frequency.

33. The method according to claim 31, further comprising determining the available room for depositing error components also by considering an attenuation of a power amplifier.

34. The method according to claim 21, further comprising obtaining a frequency response for manipulating a frequency spectrum of the error components from the frequency response of an antenna, the frequency response of an apparatus.

35. The method according to claim 21, wherein the at least one passband corresponds to at least one carrier having a predetermined bandwidth.

36. The method according to claim 21, further comprising determining the amount of the error components in a certain frequency range of an antenna filter's stopband as a function of the position of the frequency range.

37. The method according to claim 21, further comprising attenuating frequencies in the at least one stopband with respect to frequencies passed in the at least one passband.

38. The method according to claim 21, wherein the method is carried out in a base station or in a mobile device.

39. A computer program embodied on a non-transitory computer-readable medium, said computer program comprising computer-executable code which, when executed in hardware, causes the hardware to perform a method according to claim 21.

* * * * *